United States Patent
Lee et al.

(10) Patent No.: US 9,923,580 B2
(45) Date of Patent: Mar. 20, 2018

(54) ERROR CORRECTION DECODER AND OPERATION METHOD OF THE ERROR CORRECTION DECODER

(71) Applicant: Samsung Electronics Co., Ltd., Suwon-si, Gyeonggi-do (KR)

(72) Inventors: Kijun Lee, Seoul (KR); Myungkyu Lee, Seoul (KR); Sejin Lim, Seoul (KR); Junjin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 64 days.

(21) Appl. No.: 14/877,448

(22) Filed: Oct. 7, 2015

(65) Prior Publication Data
US 2016/0103735 A1   Apr. 14, 2016

(30) Foreign Application Priority Data

Oct. 13, 2014 (KR) .................. 10-2014-0137562

(51) Int. Cl.
*H03M 13/37* (2006.01)
*H03M 13/15* (2006.01)

(52) U.S. Cl.
CPC ..... *H03M 13/3715* (2013.01); *H03M 13/157* (2013.01); *H03M 13/1525* (2013.01); *H03M 13/1545* (2013.01)

(58) Field of Classification Search
CPC .................. H03M 13/157; H03M 13/3715
See application file for complete search history.

(56) References Cited

U.S. PATENT DOCUMENTS

| | | | |
|---|---|---|---|
| 5,414,719 A | * | 5/1995 | Iwaki ............... G06F 7/724 708/492 |
| 7,206,992 B2 | | 4/2007 | Xin et al. |
| 7,249,310 B1 | | 7/2007 | Feng et al. |
| 7,679,133 B2 | | 3/2010 | Son et al. |
| 7,721,185 B1 | * | 5/2010 | Feng ............... H03M 13/1515 714/784 |
| 7,774,688 B1 | | 8/2010 | Teng et al. |
| 8,301,987 B2 | | 10/2012 | Dror et al. |
| 8,335,977 B2 | | 12/2012 | Weingarten et al. |
| 8,433,985 B2 | | 4/2013 | Kwok et al. |
| 8,458,536 B2 | | 6/2013 | Yang |
| 8,458,574 B2 | | 6/2013 | Weingarten et al. |
| 8,553,466 B2 | | 10/2013 | Han et al. |
| 8,559,235 B2 | | 10/2013 | Yoon et al. |
| 8,607,128 B2 | | 12/2013 | Weingarten et al. |
| 8,650,467 B1 | | 2/2014 | Anholt |
| 8,654,587 B2 | | 2/2014 | Yoon et al. |

(Continued)

*Primary Examiner* — Steve Nguyen
(74) *Attorney, Agent, or Firm* — Harness, Dickey & Pierce, P.L.C.

(57) ABSTRACT

The inventive concepts relate to an operation method of an error correction decoder correcting an error of data read from a nonvolatile memory. The operation method may include receiving the data from the nonvolatile memory, performing a first error correction with respect to the received data in a simplified mode, and performing, when the first error correction fails in the simplified mode, a second error correction with respect to the received data in a full mode. When the first error correction of the simplified mode is performed, a part of operations of the second error correction of the full mode may be omitted.

19 Claims, 16 Drawing Sheets

(56) References Cited

U.S. PATENT DOCUMENTS

| | | | |
|---|---|---|---|
| 8,694,858 B2 | 4/2014 | Kong et al. | |
| 8,949,697 B1* | 2/2015 | Chang | H03M 13/1515 |
| | | | 708/492 |
| 9,037,941 B2* | 5/2015 | Dong | G06F 11/1012 |
| | | | 714/755 |
| 2004/0181735 A1 | 9/2004 | Xin et al. | |
| 2007/0016839 A1* | 1/2007 | Chiou | H03M 13/45 |
| | | | 714/774 |
| 2009/0121271 A1 | 5/2009 | Son et al. | |
| 2009/0217140 A1* | 8/2009 | Jo | G06F 11/1068 |
| | | | 714/785 |
| 2009/0282319 A1* | 11/2009 | No | H03M 13/1108 |
| | | | 714/780 |
| 2009/0292976 A1 | 11/2009 | Kikuchi et al. | |
| 2010/0017684 A1 | 1/2010 | Yang | |
| 2010/0131831 A1 | 5/2010 | Weingarten et al. | |
| 2010/0199149 A1 | 8/2010 | Weingarten et al. | |
| 2010/0257433 A1 | 10/2010 | Weingarten et al. | |
| 2011/0107188 A1* | 5/2011 | Dror | H03M 13/152 |
| | | | 714/773 |
| 2011/0216603 A1 | 9/2011 | Han et al. | |
| 2011/0233648 A1 | 9/2011 | Seol et al. | |
| 2011/0239094 A1 | 9/2011 | Kwok et al. | |
| 2012/0051143 A1 | 3/2012 | Yoon et al. | |
| 2012/0290896 A1* | 11/2012 | Kong | H03M 13/152 |
| | | | 714/763 |
| 2012/0290901 A1* | 11/2012 | Kong | G06F 1/3225 |
| | | | 714/781 |
| 2013/0279262 A1 | 10/2013 | Yoon et al. | |
| 2014/0068392 A1 | 3/2014 | Kokubun et al. | |
| 2014/0281840 A1* | 9/2014 | Mula | H03M 13/1515 |
| | | | 714/784 |

* cited by examiner

ERROR CORRECTION DECODER AND OPERATION METHOD OF THE ERROR CORRECTION DECODER

CROSS-REFERENCE TO RELATED APPLICATIONS

This U.S. non-provisional patent application claims priority under 35 U.S.C. § 119 of Korean Patent Application No. 10-2014-0137562, filed on Oct. 13, 2014, the entire contents of which are hereby incorporated by reference.

BACKGROUND OF THE INVENTION

Some of the inventive concepts relate to electronic devices, and more particularly, to error correction decoders and/or operation methods of the error correction decoder.

A storage device is a device storing data according to a control of a host device such as a computer, a smart phone, a smart pad, etc. A storage device may include a device storing data in a magnetic disc such as a hard disk drive HDD, a solid state drive SSD, a semiconductor memory such as a memory card, in particular, a device storing data in a nonvolatile memory.

A nonvolatile memory includes a ROM (read only memory), a PROM (programmable ROM), an EPROM (electrically programmable ROM), an EEPROM (electrically erasable and programmable ROM), a flash memory, a PRAM (phase-change RAM), a RRAM (resistive RAM), a FRAM (ferroelectric RAM), etc.

As a semiconductor manufacturing technology is developed, an operation speed of a host device such as a computer, a smart phone, a smart pad, etc. is being improved. Capacity of contents being used in a storage device and a host device of the storage device is being increased. Accordingly, a storage device having a more improved operation speed is being desired.

An error correction is one of main factors affecting an operation speed of a storage device. Data stored in a storage device may be output to the outside after going through an error correction. If the speed of an error correction becomes fast, an operation speed of a storage device may also become fast. Thus, various methods to increase the speed of an error correction are being studied. Some proposed methods to increase the speed of an error correction increase an operation speed of the storage device while deteriorating reliability of an error correction.

SUMMARY

According to an example embodiment, an operation method of an error correction decoder correcting an error of data read from a nonvolatile memory includes receiving the data from the nonvolatile memory, performing a first error correction with respect to the received data in a simplified mode, and performing, when the first error correction fails in the simplified mode, a second error correction with respect to the received data in a full mode. A part of operations of the second error correction of the full mode may be omitted.

According to an example embodiment, an error correction decoder configured to correct an error of data read from a nonvolatile memory includes a syndrome calculation unit configured to receive the data and calculate syndromes based on the received data, a key equation solving unit configured to receive the syndromes and calculate an error location polynomial by performing a simplified error correction based on the received syndromes when a mode signal indicates a simplified mode and performing a full error correction based on the received syndromes when the mode signal indicates a full mode, a chien search unit configured to receive the error location polynomial and generate error location information by performing a chien search based on the received error location polynomial, an error correction unit configured to receive the error location information and correct an error of the received data based on the received error location information, and a control unit configured to control the mode signal.

According to an example embodiment, an error correction method includes receiving data performing a first error correction with respect to the received data in a simplified mode, the performing a first error correction including calculating syndromes based on the received data, performing a calculation loop of calculating a first error location polynomial with respect to a selected one of the syndromes, and repeating the performing a calculation loop until a number of times that a selected one of the syndromes belongs to the first error location polynomial of a previous calculation loop reaches a threshold number, and performing a second error correction of the received data in a full mode when the first error correction is terminated early without completely performing the repeating with respect to respective syndromes.

BRIEF DESCRIPTION OF THE DRAWINGS

Example embodiments of the inventive concepts will be described below in more detail with reference to the accompanying drawings. The example embodiments of the inventive concepts may, however, be embodied in different forms and should not be constructed as limited to the example embodiments set forth herein. Rather, these example embodiments are provided so that this disclosure will be thorough and complete, and will fully convey the scope of the inventive concepts to those skilled in the art. Like numbers refer to like elements throughout.

DETAILED DESCRIPTION

Figure 1:
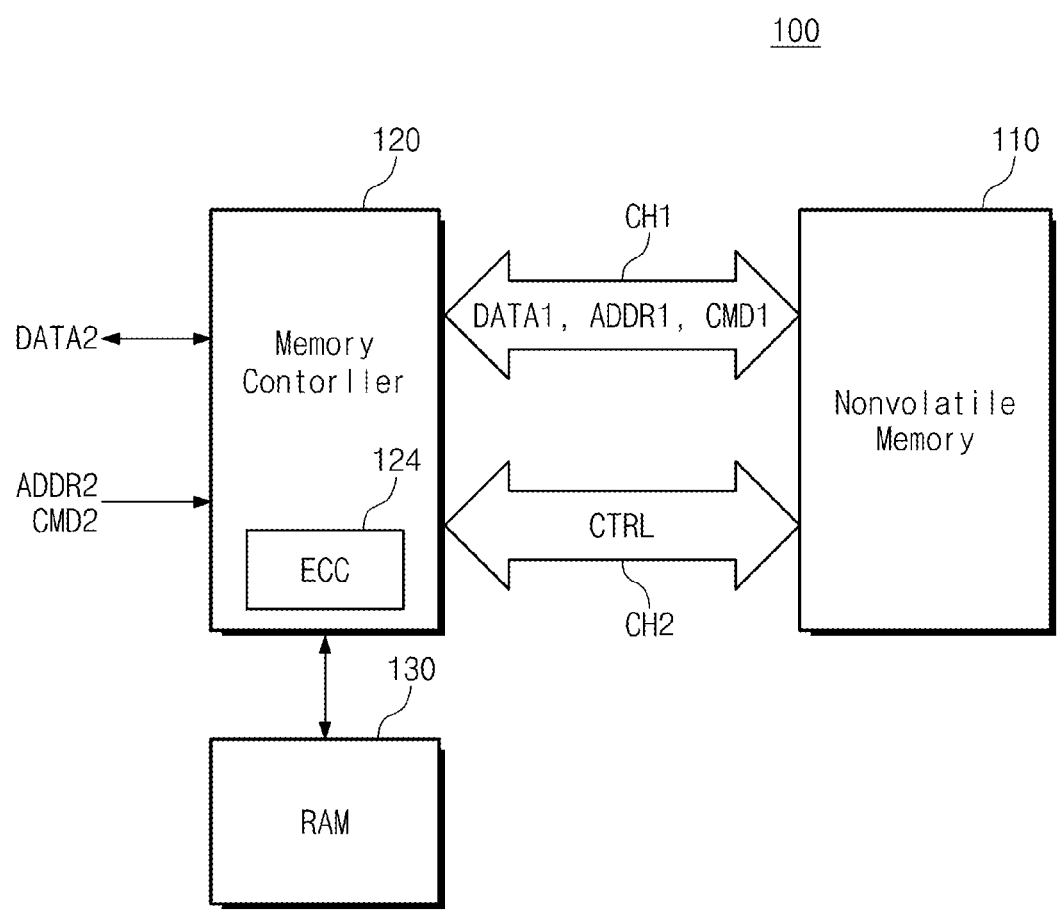
FIG. 1 is a block diagram illustrating a storage device in accordance with an example embodiment of the inventive concepts.

Example embodiments of inventive concepts will be described more fully hereinafter with reference to the accompanying drawings, in which example embodiments of the invention are shown. This inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The term 'unit' or 'module', "body" "member" as used herein, means, but is not limited to, a software or hardware component, such as a Field Programmable Gate Array (FPGA) or Application Specific Integrated Circuit (ASIC), which performs certain tasks. A unit or module may advantageously be configured to reside on the addressable storage medium and configured to execute on one or more processors. Thus, a unit or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units or modules may be combined into fewer components and units or modules or further separated into additional components and units or modules.

Hereinafter, some example embodiments will be explained in further detail with reference to the accompanying drawings.

FIG. 1 is a block diagram illustrating a storage device 100 in accordance with an example embodiment of the inventive concepts. Referring to FIG. 1, the storage device 100 includes a nonvolatile memory 110, a memory controller 120 and a RAM 130.

The nonvolatile memory 110 can perform write, read and erase operations under the control of the memory controller 120. The nonvolatile memory 110 can exchange first data DATA1 with the memory controller 120. For example, the nonvolatile memory 110 can receive the first data DATA1 from the memory controller 120 and write the first data DATA1. The nonvolatile memory 110 can perform a read operation and output the first read data DATA1 to the memory controller 120.

The nonvolatile memory 110 can receive a first command CMD1 and a first address ADDR1 from the memory controller 120. The nonvolatile memory 110 can exchange a control signal CTRL with the memory controller 120. For example, the nonvolatile memory 110 can receive at least one of a chip select signal/CE selecting at least one semiconductor chip among a plurality of semiconductor chips constituting the nonvolatile memory 110, a command latch enable signal CLE indicating that a signal being received from the memory controller 120 is a first command CMD1, an address latch enable signal indicating that a signal being received from the memory controller 120 is a first address ADDR1, a read enable signal which is generated by the memory controller 120 in a read operation and is periodically toggled to be used to adjust the timing, a write enable signal being activated by the memory controller 120 when the first command CMD1 or the first address ADDR1 is transmitted, a write protection signal being activated by the memory controller 120 to prevent or mitigate an unwanted write or erase when a power supply is changed, and a data strobe signal which is generated by the memory controller 120 in a write operation and is periodically toggled to be used to adjust an input sync of the first data DATA1. For example, the nonvolatile memory 110 can output at least one of a ready & busy signal (which indicates whether the nonvolatile memory 110 is performing a program, erase or read operation) and a data strobe signal (which is generated from the read enable signal by the nonvolatile memory 110 and is periodically toggled to be used to adjust an output sync of the first data DATA1).

The first data DATA1, the first address ADDR1 and the first command CMD1 can communicate with the memory controller 120 through a first channel CH1. The first channel CH1 may be an input/output channel. The control signal CTRL can communicate with the memory controller 120 through a second channel CH2. The second channel CH2 may be a control channel.

The nonvolatile memory 110 may include a flash memory. However, the nonvolatile memory 110 is not limited to include a flash memory. The nonvolatile memory 110 may include at least one of various types of nonvolatile memories, for example, a PRAM (phase-change RAM), a MRAM (magnetic RAM), an RRAM (resistive RAM), or a FRAM (ferroelectric RAM).

The memory controller 120 may be configured to control the nonvolatile memory 110. For example, the memory controller 120 can control so that the nonvolatile memory 110 performs a write, read or erase operation. The memory controller 120 can exchange the first data DATA1 and the control signal CTRL with the nonvolatile memory 110 and can output the first command CMD1 and the first address ADDR1 to the nonvolatile memory 110.

The memory controller 120 can control the nonvolatile memory 110 under the control of a host device (not shown). The memory controller 120 can exchange second data with the host device and can receive a second command CMD2 and a second address ADDR2 from the host device.

The memory controller 120 can exchange the first data DATA1 with the nonvolatile memory 110 by a first unit (for example, a time unit or a data unit) and can exchange the second data DATA2 with the host device by a second unit different from the first unit.

The memory controller 120 can exchange the first data DATA1 with the nonvolatile memory 110 according to a first format and can transmit the first command CMD1 and the first address ADDR1 to the nonvolatile memory 110. The memory controller 120 can exchange the second data DATA2 with the host device according to a second format different from the first format and can receive the second command CMD2 and the second address ADDR2 from the host device.

The memory controller 120 can use the RAM 130 as a buffer memory, a cache memory or an operation memory. For example, the memory controller 120 can receive the second data DATA2 from the host device, store the received second data DATA2 in the RAM 130 and write the second data DATA2 stored in the RAM 130 in the nonvolatile memory 110 as the first data DATA1. The memory controller 120 can read the first data DATA1 from the nonvolatile memory 110, store the received first data DATA1 in the RAM 130 and output the first data DATA1 stored in the RAM 130 to the host device as the second data DATA2. The memory controller 120 can store data read from the nonvolatile memory 110 in the RAM 130 and write the data stored in the RAM 130 in the nonvolatile memory 110 again.

The memory controller 120 can store in the RAM 130 data or code needed to manage the nonvolatile memory 110. For example, the memory controller 120 can read data or code needed to manage the nonvolatile memory 110 from the nonvolatile memory 110 and/or can load the data or the code into the RAM 130 to drive the data or the code.

The memory controller 120 may include an error correction block 124. The error correction block 124 can generate a parity based on the first data DATA1 being written in the nonvolatile memory 110. The generated parity can be written in the nonvolatile memory 110 together with the first data DATA1. An operation of generating the parity may be an error correction encoding operation. The error correction block 124 can receive the first data DATA1 and the parity from the nonvolatile memory 110. The error correction block 124 can correct an error of the first data DATA1 using the received parity. An operation of correcting an error may be an error correction decoding operation.

In an error correction decoding operation, the error correction block 124 can perform a simplified error correction and/or a full error correction. The simplified error correction may be an error correction having a reduced error correction time. The full error correction may be an error correction having improved reliability. The error correction block 124 can improve an operation speed and reliability of the storage device 100 by selectively performing the simplified error correction and/or the full error correction.

The RAM 130 may include at least one of various random access memories, for example, a DRAM (dynamic RAM), a SRAM (static RAM), a SDRAM (synchronous DRAM), a PRAM (phase-change RAM), a MRAM (magnetic RAM), a RRAM (resistive RAM), or a FRAM (ferroelectric RAM).

The storage device 100 can perform an address mapping to reduce an overhead that an error operation occurs in the storage device 100. For example, when an overwrite operation is requested from the external host device, the storage device 100 can store overwrite requested data in memory cells of a free storage space instead of erasing memory cells storing existing data to store the overwrite requested data in the erased memory cells. The memory controller 120 can drive a FTL (flash translation layer), which performs a mapping between a logical address being used in the external host device and a physical address being used in the nonvolatile memory 110 according to the above-described method. For example, the second address ADDR2 may be a logical address and the first address ADDR1 may be a physical address.

The storage device 100 can perform a write, read or erase of data according to a request of the host device. The storage device 100 may include a solid state drive SSD or a hard disk drive HDD. The storage device 100 may include memory cards, for example, a personal computer memory card international association (PCMCIA) card, a compact flash (CF) card, a smart media card (SM, SMC), a memory stick, a multimedia card (MMC, RS-MMC, MMCmicro), a SD card (SD, miniSD, microSD, SDHC), a universal flash memory device (UFS), etc.

The storage device 100 may include a mounted type memory such as an eMMC (embedded multimedia card), a UFS, a PPN (perfect page new), etc.

Figure 2:
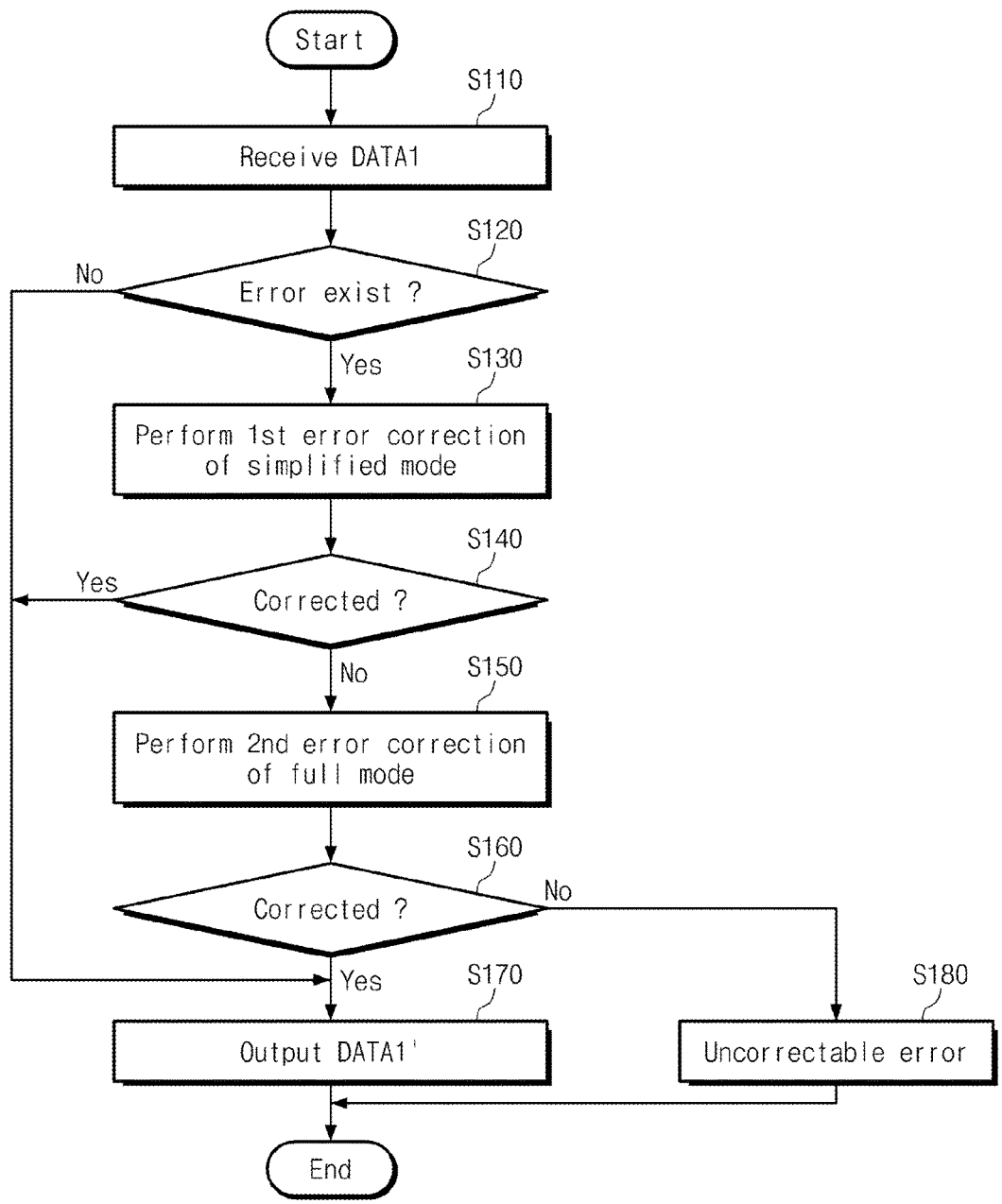
FIG. 2 is a flow chart illustrating an operation method of an error correction block in accordance with an example embodiment of the inventive concepts.

FIG. 2 is a flow chart illustrating an operation method of an error correction block in accordance with an example embodiment of the inventive concepts. Referring to FIGS. 1 and 2, in a step S110, the first data DATA1 is received. For example, the error correction block 124 can receive the first data DATA1 from the nonvolatile memory 110.

In a step S120, the error correction block 124 determines whether an error exists in the received first data DATA1. If an error does not exist in the received first data DATA1, the error correction block 124 can output the received first data DATA1 as error-corrected data DATA 1' (or error-free data), for example, having no error. If an error exists in the received first data DATA1, a step S130 is performed. In an example, the step S120 may be omitted. For example, when the first data DATA1 is received, the step S130 may be immediately performed without determining whether an error exists in the received first data DATA1.

In the step S130, the error correction block 124 performs a first error correction of a simplified mode.

In a step S140, it is determined whether all errors of the received first data DATA1 are corrected. If it is determined that all errors are corrected, that is, the first error correction is successful, in a step S170, the error correction block 124 can output error corrected first data DATA1'. If it is determined that some of the errors are not corrected, that is, the first error correction fails, a step S150 may be performed.

In the step S150, the error correction block 124 performs a second error correction of a full mode.

In a step S160, it is determined whether all the errors of the received first data DATA1 are entirely corrected. If errors are entirely corrected, that is, the second error correction is succeeded, in the step S170, the error correction block 124 can output error corrected first data DATA1'. If errors are not entirely corrected, that is, the second error correction fails, a step S180 may be performed.

In the step S180, the error correction block 124 may determine that the first data DATA1 has an error beyond an error correction capability of the error correction block 124. That is, the error correction block 124 may determine that the first data DATA1 has uncorrectable errors.

In the second error correction of the full mode, an error correction process with respect to the received first data DATA1 can be performed in a complete manner. In the first error correction of the simplified mode, a part or a portion of the error correction process of the first error correction may be omitted or be performed in a simplified manner. For example, in the first error correction of the simplified mode, in the case that a specific or desired condition is satisfied, an error correction process may be terminated early.

According to the example embodiment described above, the first error correction of the simplified mode having a relatively high error correction speed is performed with respect to the first data DATA1 being received from the nonvolatile memory 110. Thus, an operation speed of the storage device 100 may be improved. When the first error correction of the simplified mode fails, the second error correction of the full mode having relatively high reliability may be performed. Thus, reliability of the storage device 100 may be improved.

Figure 3:
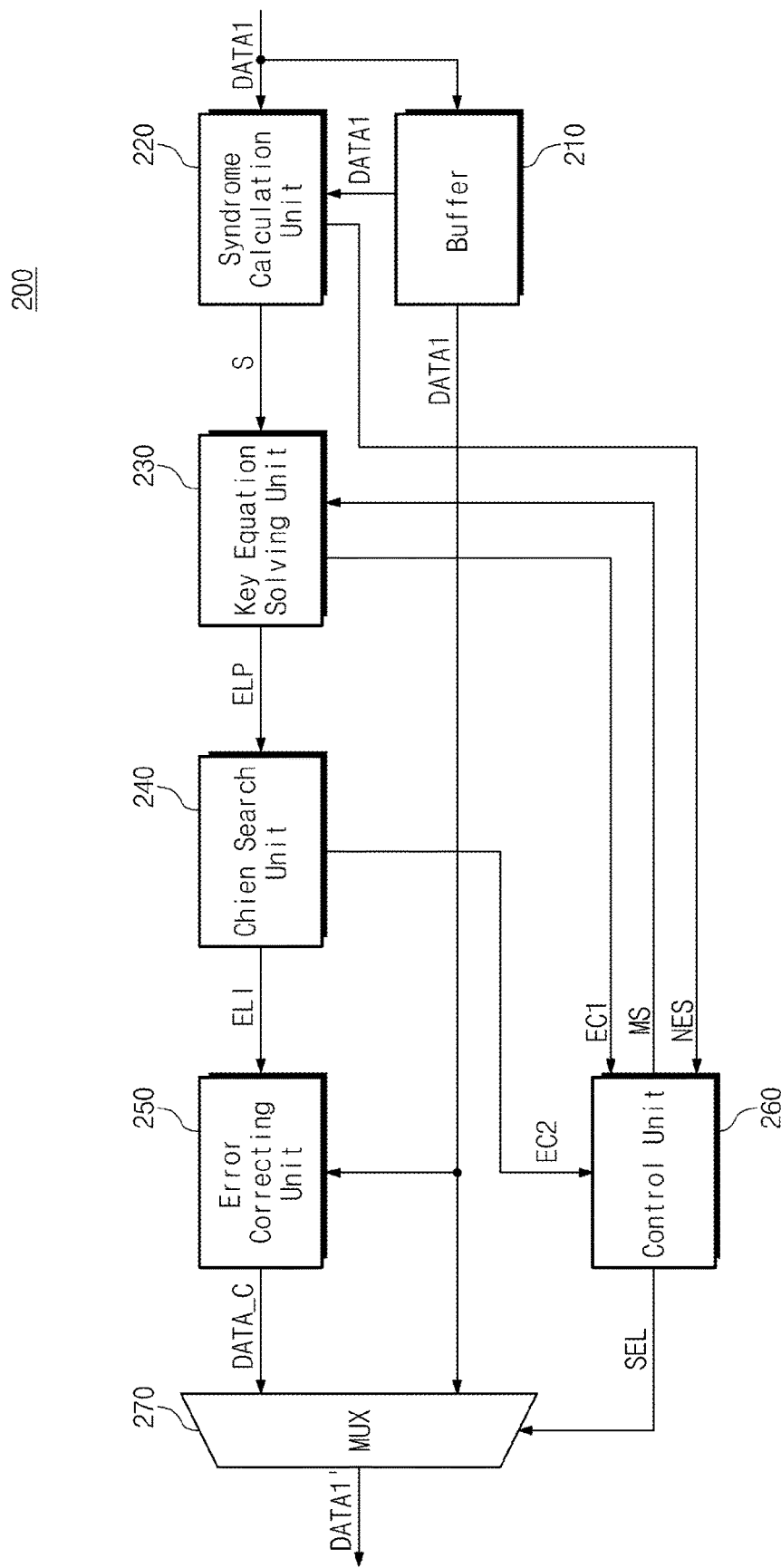
FIG. 3 is a block diagram illustrating an error correction decoder in accordance with a first example embodiment of the inventive concepts.

FIG. 3 is a block diagram illustrating an error correction decoder in accordance with a first example embodiment of the inventive concepts. Some blocks performing an error correction decoding in the error correction block 124 of FIG. 1 are illustrated in FIG. 3.

Referring to FIGS. 1 and 3, an error correction decoder 200 may include a buffer 210, a syndrome calculation unit 220, a key equation solving unit 230, a chien search unit 240, an error correction unit 250, a control unit 260, and a multiplexer 270.

The buffer 210 may be configured to store the first data DATA1 received from the nonvolatile memory 110. The buffer 210 may be a memory provided inside the error correction decoder 200. In some example embodiments, the buffer 210 may be a memory provided outside the error correction decoder 200 and may be illustrated and described together with the error correction decoder 200 to describe a function of the error correction decoder 200.

The syndrome calculation unit 220 may be configured to calculate syndromes S on the basis of the first data DATA1 received from the nonvolatile memory 110 or the first data DATA1 received from the buffer 210. For example, the syndrome calculation unit 220 can perform an arithmetic operation on the received first data DATA1 and a desired (or alternatively, predetermined) parity check matrix to calculate syndromes S. The calculated syndromes S may be output to the key equation solving unit 230. If the calculated syndromes S are '0', the syndrome calculation unit 220 can activate a control signal NES.

The key equation solving unit 230 can receive the syndromes S from the syndrome calculation unit 220. The key equation solving unit 230 may be configured to calculate an ELP (error location polynomial) based on the calculated syndromes S. For example, the key equation solving unit 230 can calculate the ELP (error location polynomial) based on a BMA (Berlekamp-Massey Algorithm) or a MEA (modified Euclidean Algorithm). In an embodiment, the key equation solving block 230 may include a calculation unit for calculating an error valuator polynomial.

When a mode signal MS indicates a simplified mode, the key equation solving unit 230 can calculate the ELP (error location polynomial) in the simplified mode based on the calculated syndromes S. When a mode signal MS indicates a full mode, the key equation solving unit 230 can calculate the ELP (error location polynomial) in the full mode based on the calculated syndromes S.

The key equation solving unit 230 can output the number of errors estimated by the calculated ELP (error location polynomial) as a first error count EC1. For example, the key equation solving unit 230 can output the degree of the highest order of the calculated ELP (error location polynomial) as the first error count EC1.

The chien search unit 240 can receive the ELP (error location polynomial) from the key equation solving unit 230. The chien search unit 240 can search locations of errors of the received first data DATA1 based on the received ELP (error location polynomial). For example, the chien search unit 240 can search roots of the ELP (error location polynomial) using a primitive element. The chien search unit 240 can search roots of the ELP (error location polynomial) among primitive elements and exponentiations of the primitive elements. Indexes of the roots of the ELP (error location polynomial) may indicate locations of errors of the received first data DATA1. The chien search unit 240 can output information of the locations of the searched errors as ELI (error location information). The chien search unit 240 can output the number of the searched roots, that is, the number of the searched errors, as a second error count EC2.

The error correction unit 250 can receive the error location information ELI from the chien search unit 240 and can receive the first data from the buffer 210. The error correction unit 250 can correct an error of the first data DATA1 based on the error location information ELI. For example, the error correction unit 250 can invert bits of the first data DATA1 which the error location information ELI indicates. Data DATA_C error-corrected by the error correction unit 250 is output to the multiplexer 270.

The control unit 260 may receive the control signal NES from the syndrome calculation unit 220. If the control signal NES is activated, that is, if an error does not exist in the received first data DATA1, the control unit 260 can control a select signal SEL as a first value. The control unit 260 can also inactivate the key equation solving unit 230, the chien search unit 240, and the error correction unit 250. If the control signal NES is not activated, that is, if an error exists in the received first data DATA1, the control unit 260 can control the select signal SEL as a second value. The control unit 260 can also activate the key equation solving unit 230, the chien search unit 240, and the error correction unit 250.

When the control signal NES is in an inactivate state, that is, when an error exists in the received first data DATA1, the control unit 260 can control so that the mode signal MS indicates the simplified mode. For example, a basic value of the mode signal MS may indicate the simplified mode. In the simplified mode, the control unit 260 can control the error correction decoder 200 to perform the first error correction.

In the simplified mode, if the key equation solving unit 230 calculates the ELP (error location polynomial), the control unit 260 can receive the first error count EC1 from the key equation solving unit 230. For example, in the simplified mode, the control unit 260 can receive the number of errors estimated by the ELP (error location polynomial) as the first error count EC1.

If the chien search unit 240 can calculate the error location information ELI in the simplified mode, the control unit 260 can receive the number of errors searched by the chien search unit 240 in the simplified mode as the second error count EC2.

The control unit 260 can compare the first error count EC1 with the second error count EC2. If the first error count EC1 coincides with the second error count EC2 in the simplified mode, it may be determined that the first error correction of the simplified mode is succeeded. The control unit 260 can control so that the error correction unit 250 outputs the error-corrected data DATA_C using the error location information ELI. The control unit 260 can control the select signal SEL to output the error-corrected data DATA_C as final data DATA1'.

If the first error count EC1 does not coincide with the second error count EC2 in the simplified mode, it may be determined that the first error correction of the simplified mode is failed. For example, errors beyond the correction range of the error correction decoder 200 may exist in the first data DATA1 or a calculation of the ELP (error location polynomial) in the simplified mode may be incorrect. The control unit 260 can control so that the mode signal MS indicates the full mode. The control unit 260 can control the error correction decoder 200 to perform the second error correction with respect to the first data DATA1.

If the key equation solving unit 230 calculates the ELP (error location polynomial) in the full mode, the control unit 260 can receive the first error count EC1 from the key equation solving unit 230. If the chien search unit 240 calculates the error location information ELI in the full mode, the control unit 260 can receive the second error count EC2 from the chien search unit 240.

The control unit 260 can compare the first error count EC1 with the second error count EC2. If the first error count EC1 coincides with the second error count EC2 in the full mode, it may be determined that the second error correction of the full mode is succeeded. The control unit 260 can control so that the error correction unit 250 outputs the error-corrected data DATA_C using the error location information ELI. The control unit 260 can control the select signal SEL to output the error-corrected data DATA_C as the final data DATA1'.

If the first error count EC1 does not coincide with the second error count EC2 in the full mode, it may be determined that the second error correction of the full mode fails. For example, errors beyond the correction range of the error correction decoder 200 may exist in the first data DATA1. The control unit 60 may notify the memory controller 120 or an external host communicating with the memory controller 120 that uncorrectable errors exist.

The multiplexer 270 can receive error-corrected data DATA_C from the error correction unit 250 and the first data DATA1 from the buffer 210. The multiplexer 270 can select one of the error-corrected data DATA_C and the first data DATA1 to output the selected one as final data DATA1 under the control of the select signal SEL.

Figure 4:
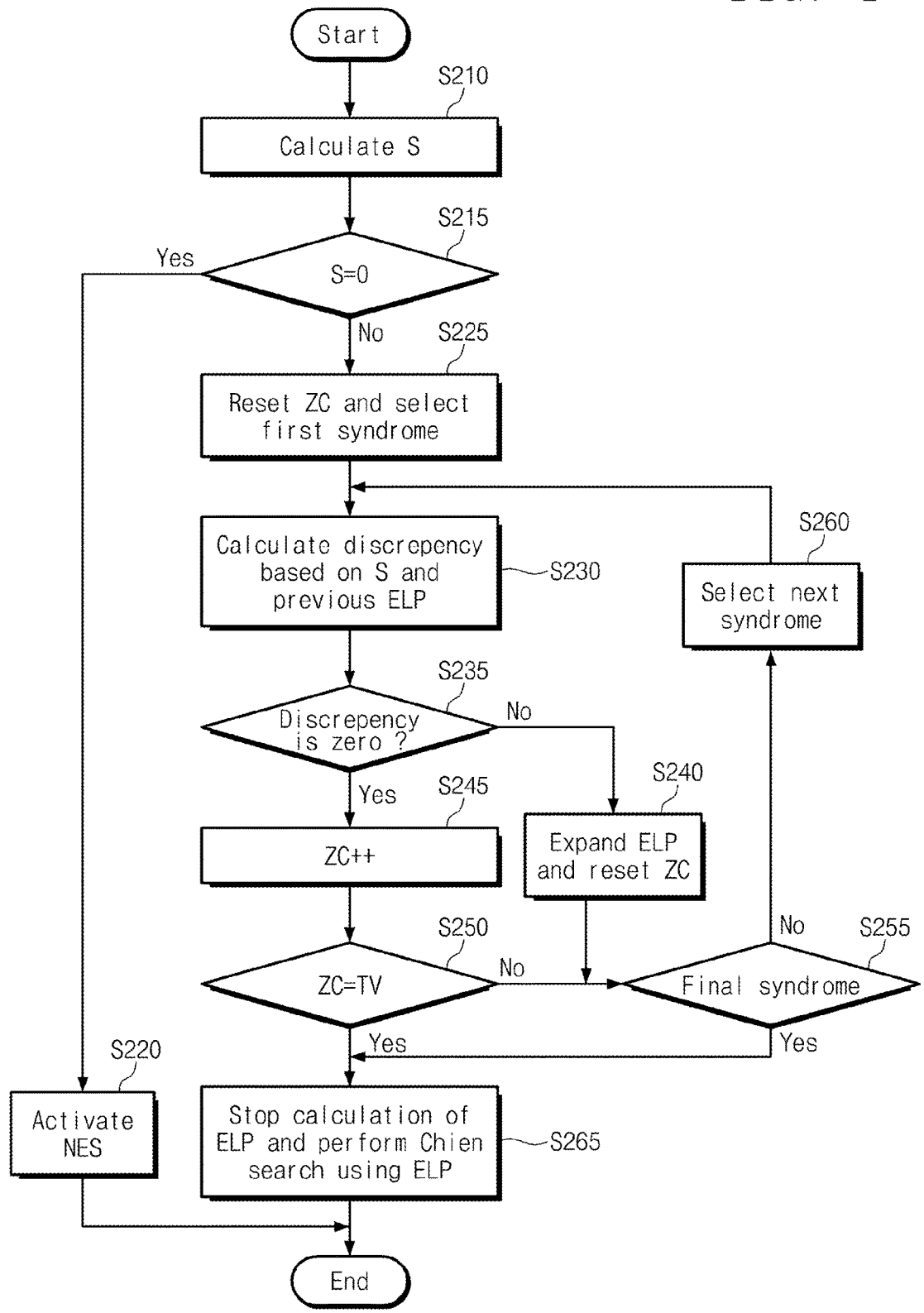
FIG. 4 is a flow chart illustrating a first error correction method in accordance with a first example embodiment of the inventive concepts.

FIG. 4 is a flow chart illustrating a first error correction method in accordance with a first example embodiment of the inventive concepts. Referring to FIGS. 3 and 4, in a step S210, the syndrome calculation unit 220 calculates syndromes S. For example, the syndrome calculation unit 220 can perform an arithmetic operation on the first data DATA1 and a parity check matrix to calculate syndromes S.

In a step S215, it is determined whether the syndromes S are '0'. If the syndromes S are '0', an error does not exist in the first data DATA1. Thus, in a step S220, the control signal NES is activated. If the control signal NES is activated, the multiplexer 270 can output the first data DATA1 as the final data DATA1'. A first error correction or a second error correction may be omitted.

Steps S225 through S260 can form a calculation loop that the key equation solving unit 230 calculates an error location polynomial (ELP). The key equation solving unit 230 can calculate the error location polynomial (ELP) by selecting different syndromes S to repeatedly perform the calculation loop.

In the step S225, the key equation solving unit 230 can reset a first variable ZC and can select a first syndrome S. For example, the first variable ZC can be reset to '0'.

In the step S230, discrepancy is calculated based on the selected syndrome S and the error location polynomial (ELP) of the previous calculation loop. For example, the discrepancy may indicate whether the selected syndrome S belongs to the error location polynomial (ELP) of the previous calculation loop or whether the selected syndrome S can be generated by the error location polynomial (ELP) of the previous calculation loop. For example, the discrepancy may be a result obtained by substituting the selected syndrome S for the error location polynomial (ELP) of the previous calculation loop.

When the discrepancy is not '0', it may be determined that the selected syndrome S does not belong to the error location polynomial (ELP) of the previous calculation loop or the selected syndrome S cannot be generated by the error location polynomial (ELP) of the previous calculation loop. When the discrepancy is not '0', in the step S240, the error location polynomial (ELP) is expanded. For example, the error location polynomial (ELP) may be expanded based on a Berlekamp-Massey algorithm (BMA) or a linear feedback shift register (LFST) synthesis. For example, the degree of the highest order of the error location polynomial (ELP) may increase by '1'. The first variable ZC is reset. For example, the first variable ZC may be reset to '0'. After that, the step S255 is performed.

When the discrepancy is '0', it may be determined that the selected syndrome S belongs to the error location polynomial (ELP) of the previous calculation loop or the selected syndrome S can be generated by the error location polynomial (ELP) of the previous calculation loop. In the case that the discrepancy is '0', the error location polynomial (ELP) of the previous calculation loop is maintained without being renewed. In the step S245, the first variable ZC increases by '1'.

In the step S250, it is determined whether the first variable ZC reaches a threshold value TV. If the first variable ZC reaches a threshold value TV, a step S265 is performed. If the first variable ZC does not reach a threshold value TV, the step S255 is performed.

When the discrepancy is not '0' or when the discrepancy is '0' and the first variable ZC is smaller than the threshold value TV, the step S255 is performed. In the step S255, it is determined whether the selected syndrome S is a final syndrome S. That is, it is determined whether the calculation loop is performed on all the syndromes S. If the selected syndrome S is the final syndrome S, the step S265 is performed. If the selected syndrome S is not the final syndrome S, the step S260 is performed.

In the step S260, next syndrome S (e.g., unused syndrome for previous calculation loops) is selected among the syndromes S. After that, a next calculation loop is performed in the step S230.

If a stop condition of the calculation loop is satisfied, the step S265 is performed. In the step S265, a calculation of the error location polynomial (ELP) is stop and a chien search is performed using the error location polynomial (ELP).

As described with reference to FIG. 4, if the calculation loop is performed on all the syndromes S (step S255), the stop condition of the calculation loop is satisfied. A calculation of the error location polynomial (ELP) is stop and a chien search is performed.

Even though the calculation loop is not performed on some of the syndromes S, that is, syndromes S not used in the calculation loop exist, if a specific condition is satisfied, the calculation loop calculating the error location polynomial (ELP) may stop early. As described with reference to the step S250, if the first variable ZC, that is, the number of times that discrepancy is continuously '0' reaches the threshold value TV, the calculation loop may stop early.

In the case that discrepancy is continuously calculated to be '0', probability that discrepancy has a value which is not '0' in a subsequent calculation loop is very low. Thus, as described with reference to the step S250, even though the calculation loop stops early, probability that the calculated error location polynomial (ELP) hits the mark is very high. Thus, if early stop algorithm is adopted in a calculation of the error location polynomial (ELP), calculation time of the error location polynomial (ELP) may be reduced, thereby reducing error correction time of the error correction decoder 200.

Figure 5:
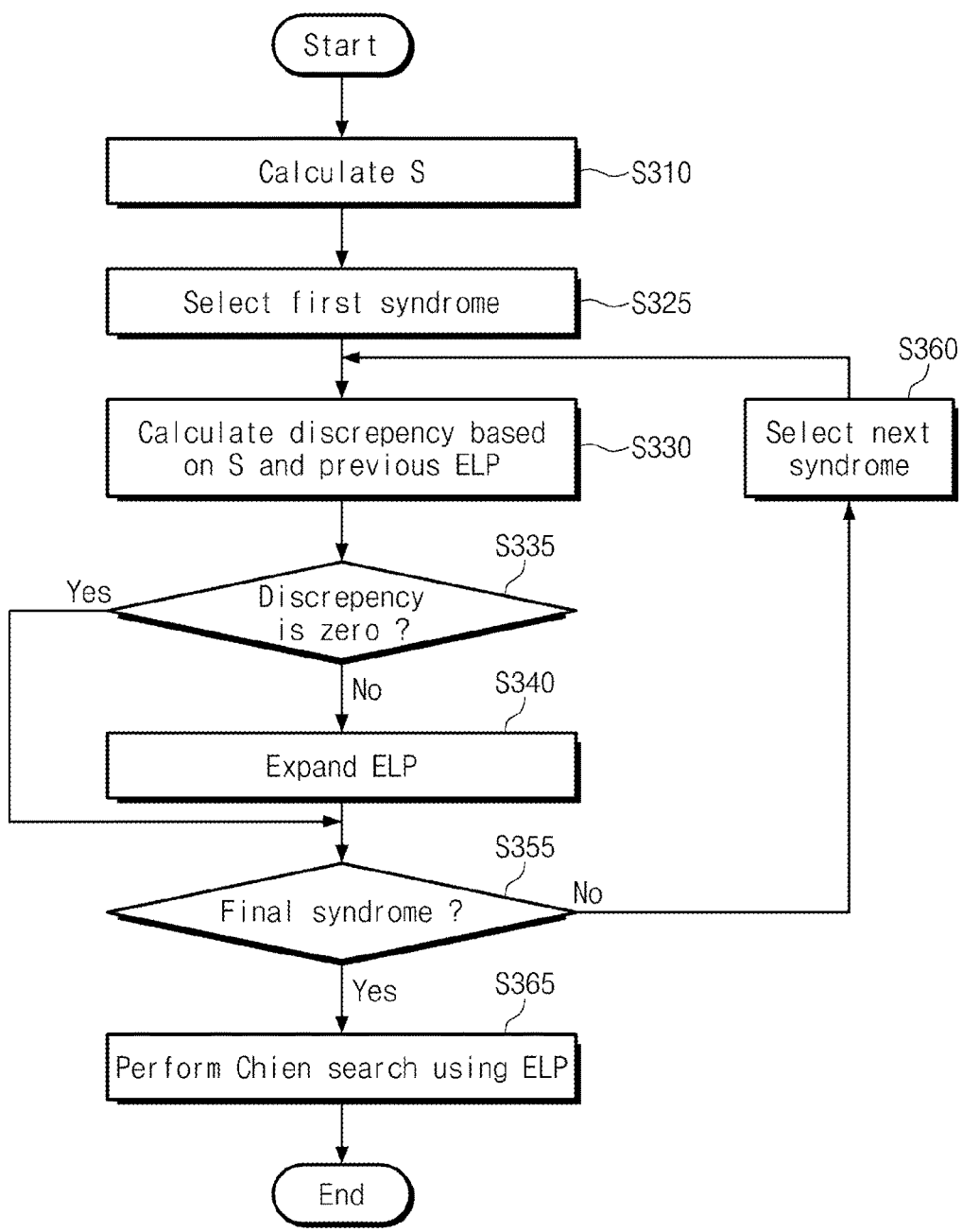
FIG. 5 is a flow chart illustrating a second error correction method in accordance with a first example embodiment of the inventive concepts.

FIG. 5 is a flow chart illustrating a second error correction method in accordance with a first example embodiment of the inventive concepts. Referring to FIGS. 3 and 5, in a step S310, the syndrome calculation unit 220 calculates syndromes S. For example, the syndrome calculation unit 220 can perform an arithmetic operation on the first data DATA1 and a parity check matrix to calculate syndromes S.

In a step S325, the key equation solving unit 230 selects a first syndrome S among the syndromes S. After that, in steps S330 through S355, the key equation solving unit 230 performs a calculation loop on the selected syndrome. The key equation solving unit 230 selects different syndromes S and can repeatedly perform the calculation loop. The key equation solving unit 230 can perform the calculation loop on all the syndromes S to calculate an error location polynomial (ELP).

In the step S330, the key equation solving unit 230 can calculate discrepancy based on the selected syndrome S and the error location polynomial (ELP) of the previous calculation loop.

In the step S335, the key equation solving unit 230 can determine whether the calculated discrepancy is '0'. If the discrepancy is not '0', in the step S340, the error location polynomial (ELP) is expanded. If the discrepancy is '0', the error location polynomial (ELP) is not renewed.

In the step S355, the key equation solving unit 230 determines whether the selected syndrome S is a final syndrome. If the selected syndrome S is not the final syndrome, next syndrome S is selected in a step S360. After that, the calculation loop is performed again in the step S330. If the selected syndrome S is the final syndrome, a chien search is performed in a step S365.

As described with reference to FIG. 5, a second error correction calculates the error location polynomial (ELP) using all the syndromes S without stopping a calculation of the error location polynomial (ELP) early. If the error location polynomial (ELP) calculated according to the first error correction described with reference to FIG. 4 is not correct, the error location polynomial (ELP) is calculated according to the second error correction described with reference to FIG. 5. Thus, reliability of error correction may be secured by the second error correction using all the syndromes S while error correction time may be reduced by the first error correction including an early stop algorithm.

Figure 6:
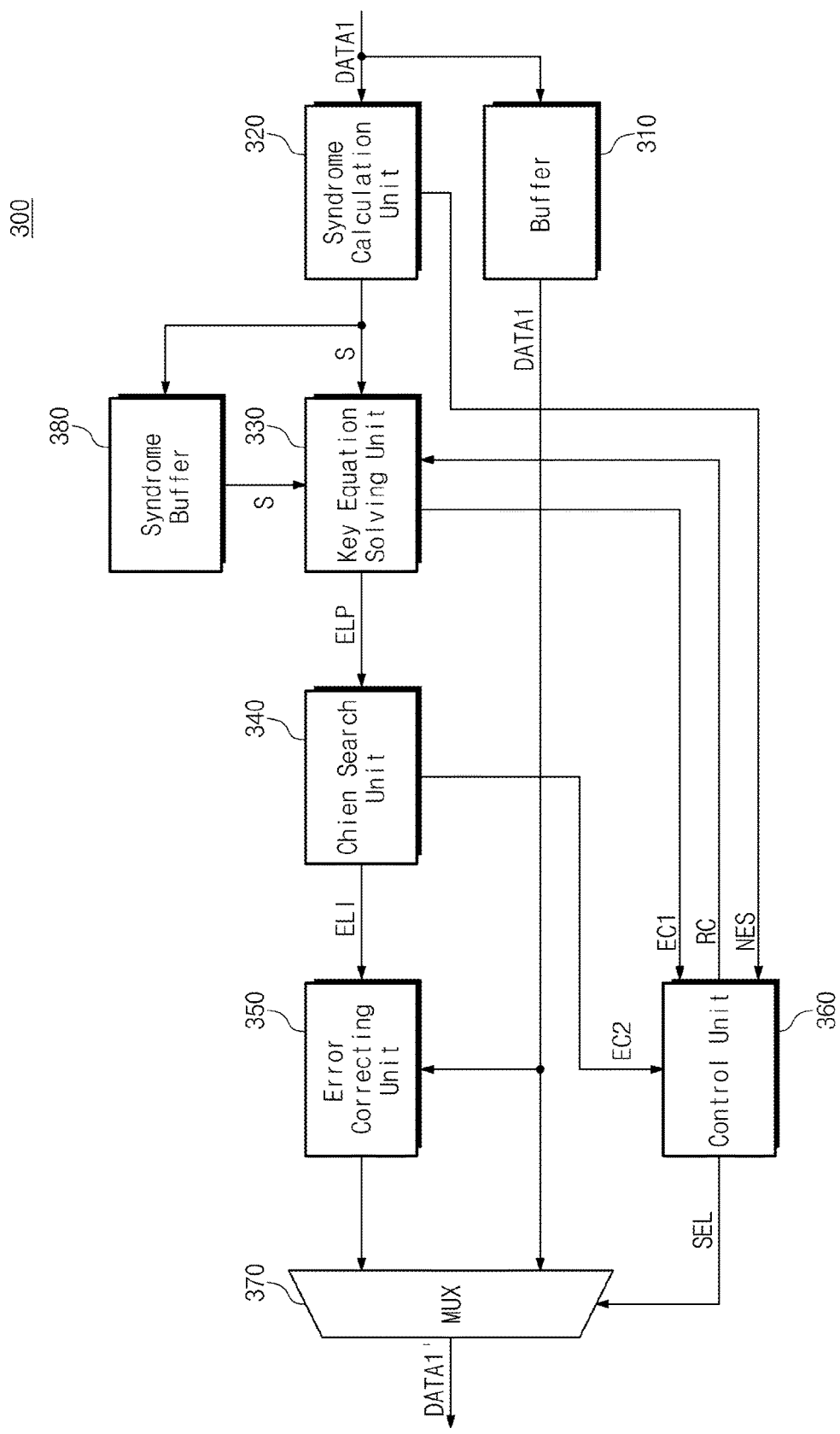
FIG. 6 is a block diagram illustrating an error correction decoder in accordance with a second example embodiment of the inventive concepts.

FIG. 6 is a block diagram illustrating an error correction decoder in accordance with a second example embodiment of the inventive concepts. Referring to FIG. 6, an error correction decoder 300 includes a buffer 310, a syndrome calculation unit 320, a key equation solving unit 330, a chien search unit 340, an error correction unit 350, a control unit 360, a multiplexer 370 and a syndrome buffer 380. As compared with the error correction decoder 200 of FIG. 3, the error correction decoder 300 further includes the syndrome buffer 380.

The syndrome buffer 380 can store syndromes S being output from the syndrome calculation unit 320 in a first error correction operation.

In the first error correction operation, the key equation solving unit 330 can receive calculated syndromes S from the syndrome calculation unit 320 or the syndrome buffer 380. In a second error correction operation, the key equation solving unit 330 can receive syndromes S stored in the syndrome buffer 380 from the syndrome buffer 380. That is, in the second error correction operation, a calculation of the syndromes S is not performed.

Figure 7:
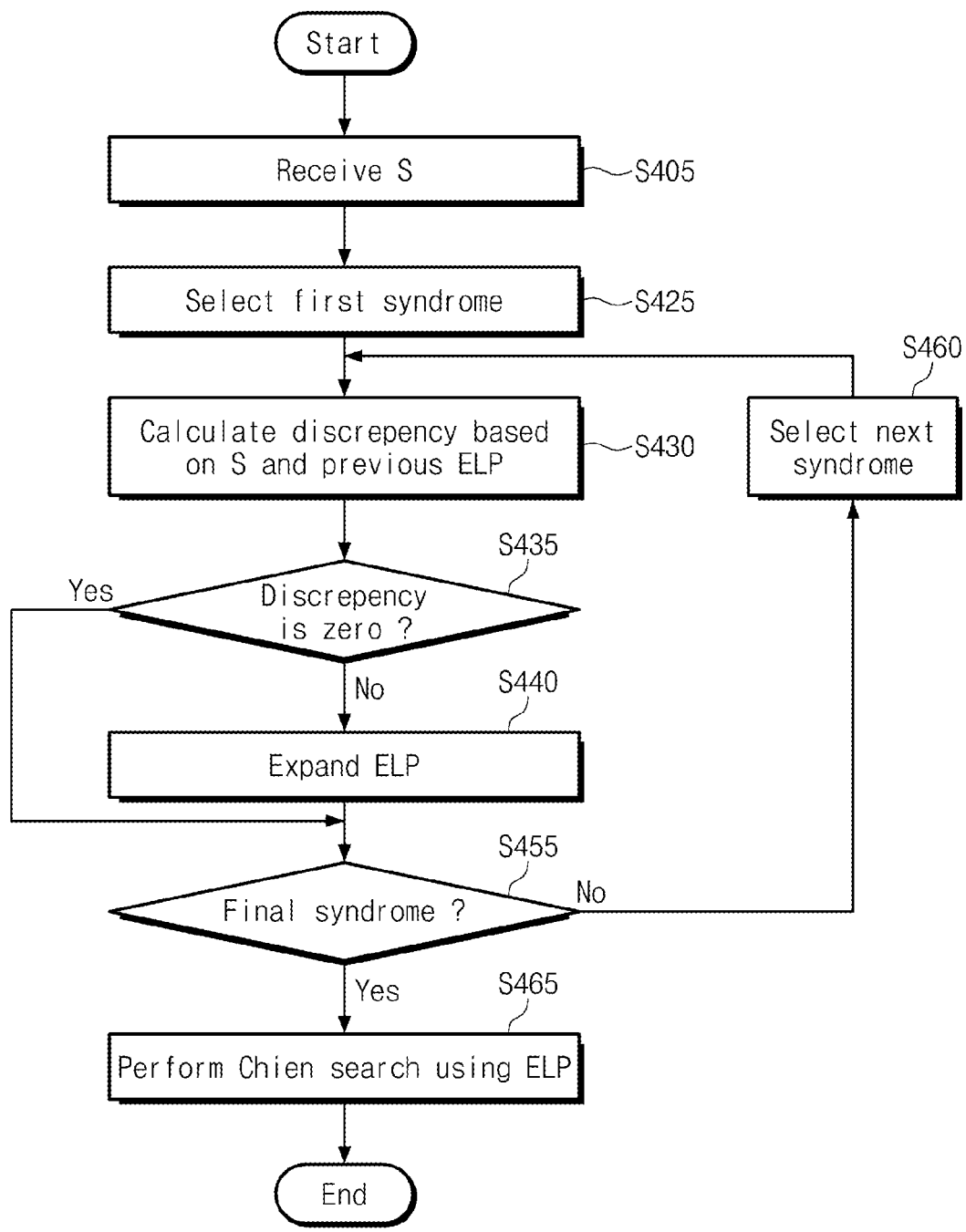
FIG. 7 is a flow chart illustrating a second error correction method in accordance with a second example embodiment of the inventive concepts.

FIG. 7 is a flow chart illustrating a second error correction method in accordance with a second example embodiment of the inventive concepts. Referring to FIGS. 6 and 7, in a step S405, the key equation solving unit 330 receives syndromes S from the syndrome buffer 380.

In a step S425, the key equation solving unit 330 selects a first syndrome S among the syndromes S. After that, in steps S430 through S455, the key equation solving unit 330 performs a calculation loop on the selected syndrome S. The key equation solving unit 330 selects different syndromes S and can repeatedly perform the calculation loop. The key equation solving unit 330 can perform the calculation loop on all the syndromes S to calculate an error location polynomial (ELP).

In the step S430, the key equation solving unit 330 can calculate discrepancy based on the selected syndrome S and the error location polynomial (ELP) of the previous calculation loop.

In the step S435, the key equation solving unit 330 can determine whether the calculated discrepancy is '0'. If the discrepancy is not '0', in the step S440, the error location polynomial (ELP) is expanded. If the discrepancy is '0', the error location polynomial (ELP) is not renewed.

In the step S455, the key equation solving unit 330 determines whether the selected syndrome S is a final syndrome. If the selected syndrome S is not the final syndrome, next syndrome S is selected in a step S460. After that, the calculation loop is performed again in the step S430. If the selected syndrome S is the final syndrome, a chien search is performed in a step S465.

As described with reference to FIGS. 6 and 7, syndromes S calculated in a first error correction operation may be stored in the syndrome buffer 380. In the second error correction operation, syndromes S are not calculated again but the syndromes S stored in the syndrome buffer 380 are used. Because an operation of calculating the syndromes S is omitted, error correction time of the error correction decoder 300 may be reduced.

Figure 8:
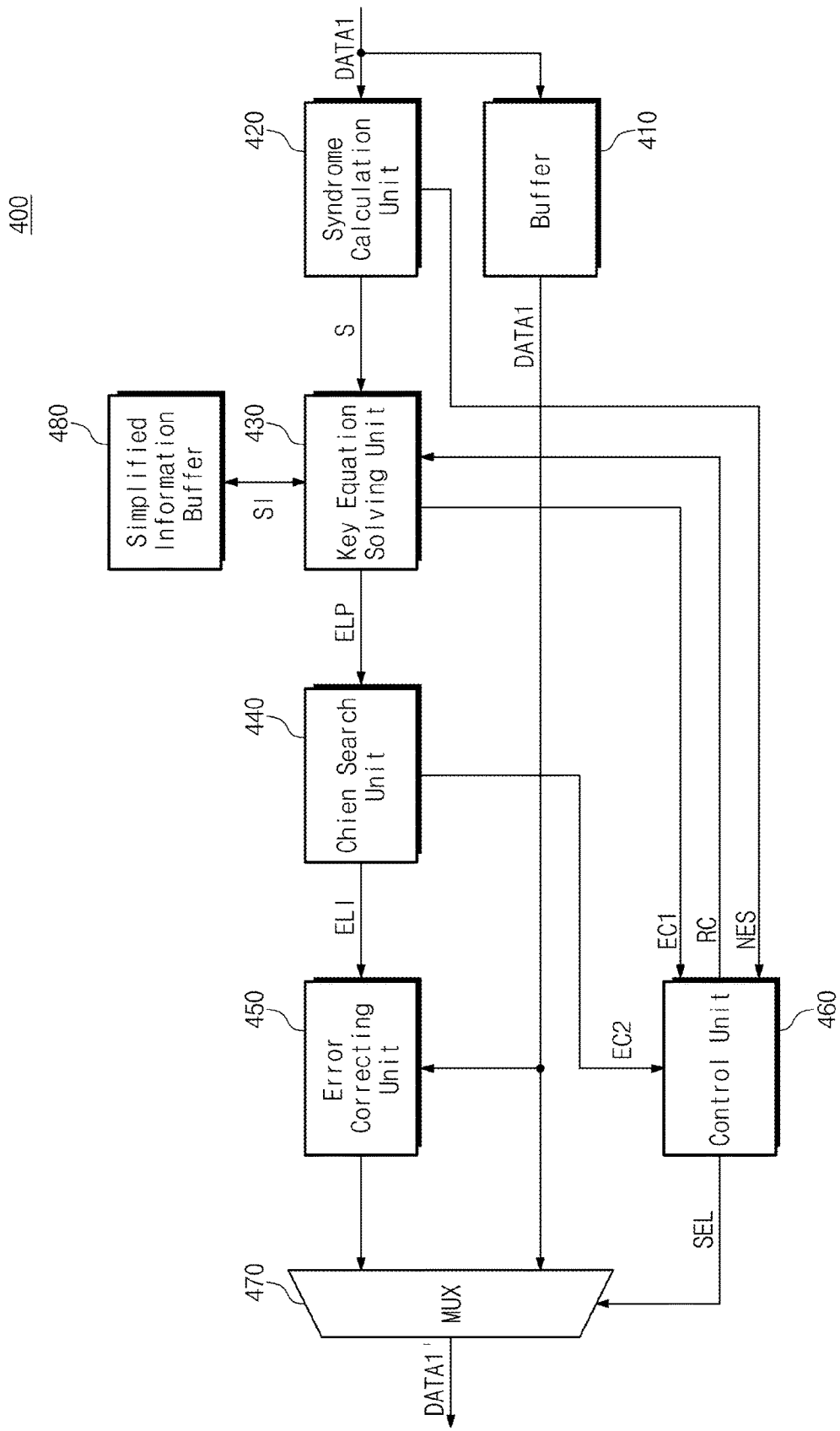
FIG. 8 is a block diagram illustrating an error correction decoder in accordance with a third example embodiment of the inventive concepts.

FIG. 8 is a block diagram illustrating an error correction decoder in accordance with a third example embodiment of the inventive concepts. Referring to FIG. 8, an error correction decoder 400 includes a buffer 410, a syndrome calculation unit 420, a key equation solving unit 430, a chien search unit 440, an error correction unit 450, a control unit 460, a multiplexer 470 and a simplified information buffer 480. As compared with the error correction decoder 200 of FIG. 3, the error correction decoder 400 further includes the simplified information buffer 480.

The simplified information buffer 480 can store information about a first error correction performed in the key equation solving unit 430 in the first error correction operation as simplified information SI. For example, an error location polynomial (ELP) and unused syndromes S calculated by the key equation solving unit 430 in the first error correction operation may be stored in the simplified information buffer 480 as the simplified information SI.

In the second error correction operation, the key equation solving unit 430 can calculate the error location polynomial (ELP) using the simplified information SI stored in the simplified information buffer 480. For example, the key equation solving unit 430 can select the error location polynomial (ELP) being received from the simplified information buffer 480 as the error location polynomial (ELP) of a previous calculation loop. The key equation solving unit 430 sequentially selects all the syndromes S or unused syndromes S received from the simplified information buffer 480 and can repeatedly perform the calculation loop.

Figure 9:
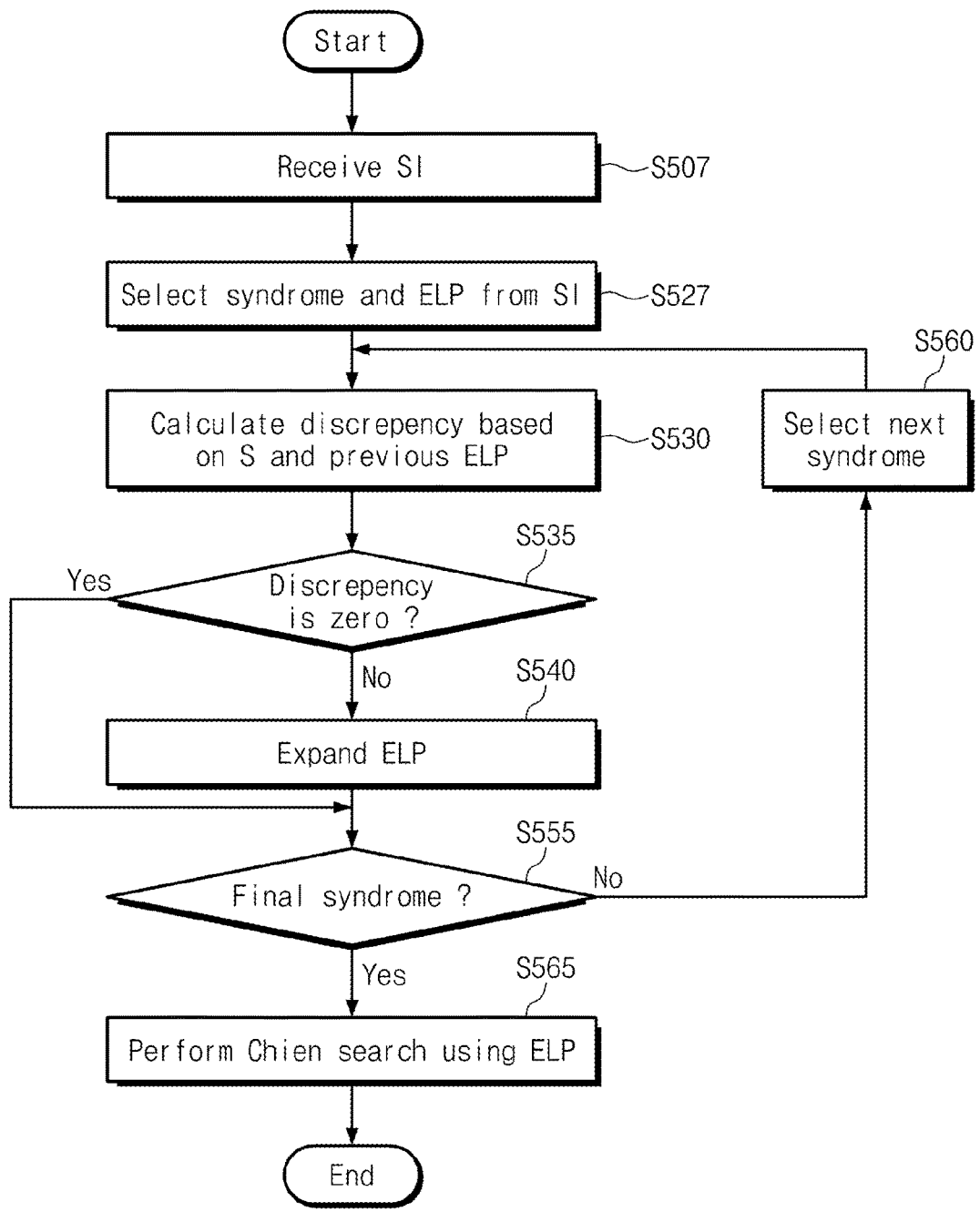
FIG. 9 is a flow chart illustrating a second error correction method in accordance with a third example embodiment of the inventive concepts.

FIG. 9 is a flow chart illustrating a second error correction method in accordance with a third example embodiment of the inventive concepts. Referring to FIGS. 8 and 9, in a step S507, the key equation solving unit 430 receives the simplified information SI from the simplified information buffer 480. The simplified information SI may include the error location polynomial (ELP) calculated by the key equation solving unit 430 and the unused syndromes S of the first error correction operation.

In a step S527, the key equation solving unit 430 selects the error location polynomial (ELP) and a first syndrome S from the simplified information SI. For example, the key equation solving unit 430 can select the error location polynomial (ELP) of the simplified information SI as the error location polynomial (ELP) of a previous calculation loop. The key equation solving unit 430 can also select one of unused syndromes S of the simplified information SI. After that, in steps S530 through S555, the key equation solving unit 430 performs a calculation loop on the selected syndrome. The key equation solving unit 430 selects different syndromes S and can repeatedly perform the calculation loop. The key equation solving unit 430 can perform the calculation loop on all the syndromes to calculate an error location polynomial (ELP).

In the step S530, the key equation solving unit 430 can calculate discrepancy based on the selected syndrome S and the error location polynomial (ELP) of the previous calculation loop.

In the step S535, the key equation solving unit 430 can determine whether the calculated discrepancy is '0'. If the discrepancy is not '0', in the step S540, the error location polynomial (ELP) is expanded. If the discrepancy is '0', the error location polynomial (ELP) is not renewed.

In the step S555, the key equation solving unit 430 determines whether the selected syndrome S is a final syndrome. If the selected syndrome S is not the final syndrome, next syndrome S is selected from the simplified information SI in a step S560. After that, the calculation loop is performed again in the step S530. If the selected syndrome S is the final syndrome, a chien search is performed in a step S565.

As described with reference to FIGS. 8 and 9, the error location polynomial (ELP) and the unused syndromes S calculated in the first error correction operation may be stored in the simplified information buffer 480. In the second error correction operation, a calculation of the error location polynomial (ELP) is additionally performed using the error location polynomial (ELP) and the unused syndromes S stored in the simplified information buffer 480. When calculating the error location polynomial (ELP) of the second error correction, a calculation which overlaps with parts calculated in the first error correction operation can be omitted. Thus, error correction time of the error correction decoder 400 may be reduced.

Figure 10:
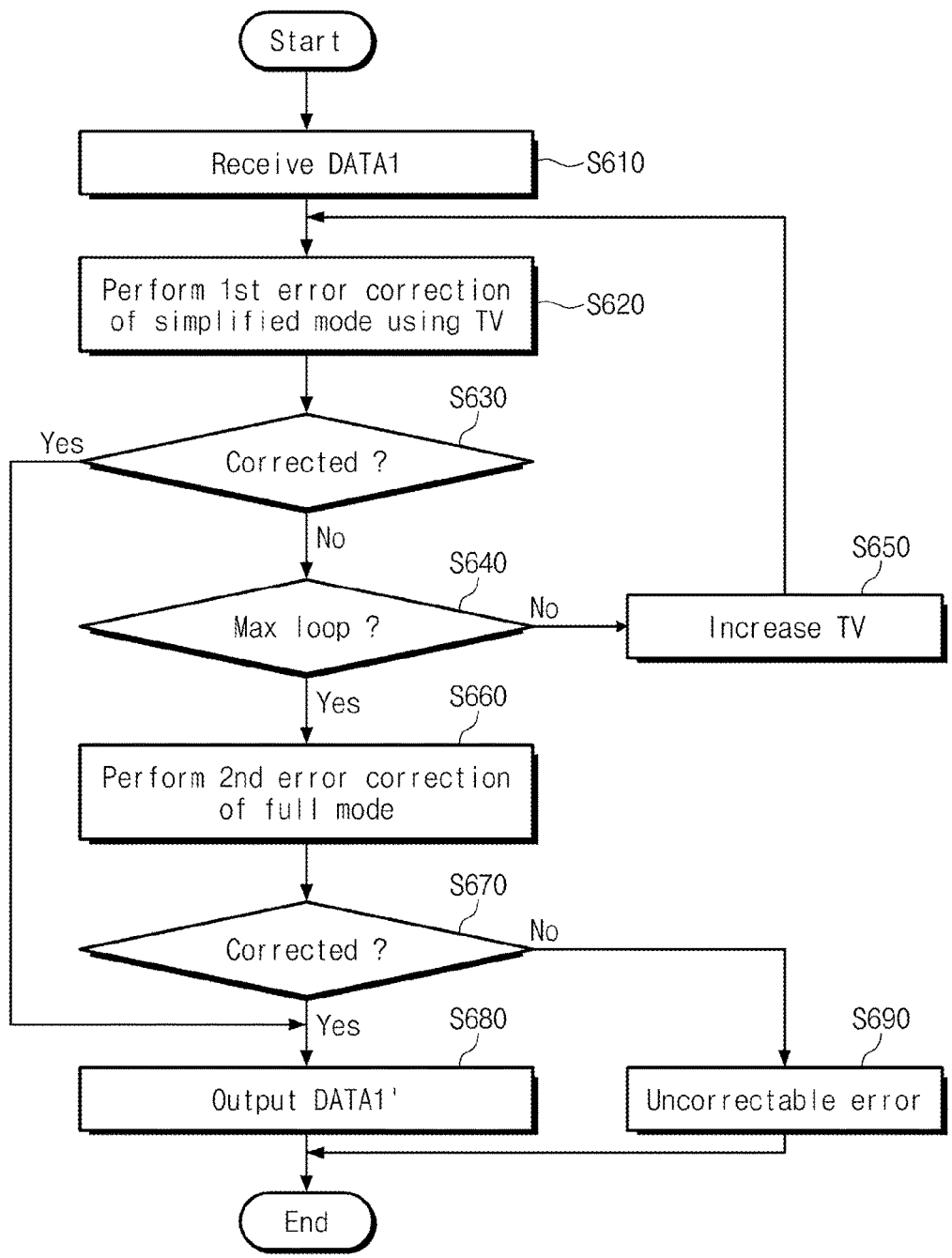
FIG. 10 is a flow chart illustrating an operation method of an error correction block in accordance with an example embodiment of the inventive concepts.

FIG. 10 is a flow chart illustrating an operation method of an error correction block in accordance with an example embodiment of the inventive concepts. Referring to FIGS. 1 and 10, in a step S610, the first data DATA1 is received.

In a step S620, the first error correction of the simplified mode is performed using the threshold value TV. For example, as described with reference to FIG. 4, the error location polynomial (ELP) may be calculated until the first variable ZC indicating the number of times discrepancy is '0' reaches the threshold value TV.

In a step S630, according to a result of the first error correction, it is determined whether all the errors of the received first data DATA1 are corrected. If errors of the received first data DATA1 are all corrected, a step S680 is performed. If errors of the received first data DATA1 are not entirely corrected, a step S640 is performed.

In the step S640, it is determined whether a maximum loop of the first error correction was performed. For example, if a loop which was performed is not the maximum loop of the first error correction, the threshold value TV increases in a step S650. After that, the step S620 is performed again. If a loop which was performed is the maximum loop of the first error correction, a step S660 is performed.

In the step S660, a second error correction of the full mode is performed. In a step S670, it is determined whether errors of the first data DATA1 are entirely corrected by the second error correction operation. If errors of the first data DATA1 are entirely corrected, in the step S680, error-corrected first data DATA1' is output. If errors of the first data DATA1 are not entirely corrected, in a step S690, it is determined that uncorrectable errors occur.

As described above, the first error correction of the simplified mode may be repeatedly performed while increasing the threshold value TV. If errors of the first data DATA1 are not entirely corrected until the first error correction is performed as much as the number of the maximum loop assigned to the first error correction, the second error correction of the full mode may be performed.

Figure 11:
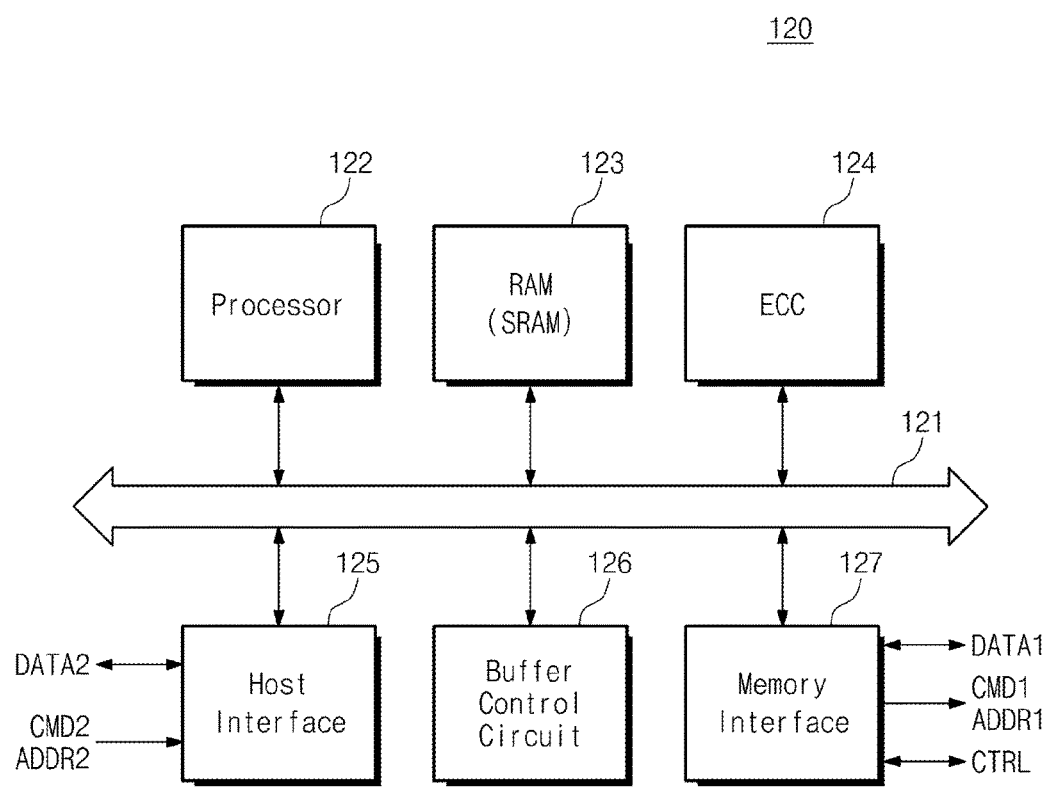
FIG. 11 is a block diagram illustrating a memory controller in accordance with an example embodiment of the inventive concepts.

FIG. 11 is a block diagram illustrating a memory controller 120 in accordance with an example embodiment of the inventive concepts. Referring to FIG. 11, the memory controller 120 includes a bus 121, a processor 122, a RAM 123, an error correction block 124, a host interface 125, a buffer control circuit 126, and a memory interface 127.

The bus 121 is configured to provide a channel between constituent elements of the memory controller 120.

The processor 122 can control an overall operation of the memory controller 120 and perform a logical operation. The processor 122 can communicate with an external host device through the host interface 125. The processor 122 can store a second command CMD2 or a second address ADDR2 received through the host interface 125 in the RAM 123. The processor 122 can generate a first command CMD1 and a first address ADDR1 according to the second command CMD2 or the second address ADDR2 and output the generated first command CMD1 and the first address ADDR1 through the memory interface 127.

The processor 122 may output through the buffer control circuit 126 the second data DATA2 received through the host interface 125 or may store in a RAM 123 the second data DATA2 received through the host interface 125. Through the memory interface 127, the processor 122 can output data stored in the RAM 123 or data being received through the buffer control circuit 126 as first data DATA1. The processor 122 may store the first data DATA1 received through the memory interface in the RAM 123 or may output the first data DATA1 through the buffer control circuit 126. The processor 122 may output data stored in the RAM 123 or data received through the buffer control circuit 126 through the host interface 125 as second data DATA2 or may output the data through the memory interface 127 as the first data DATA1.

The RAM 123 may be used as, for example, an operation memory, a cache memory or a buffer memory. The RAM 123 can store codes or commands which the processor 122 executes. The RAM 123 can store data processed by the processor 122. The RAM 123 may include a static RAM (SRAM).

The error correction block 124 can perform an error correction. The error correction block 124 can generate an error correction code (for example, parity) for performing an error correction on the basis of the first data DATA1 to be output to the memory interface 127 or the second data DATA2 received from the host interface 125. The first data DATA1 and the parity can be output through the memory interface 127. The error correction block 124 can perform an error correction of the received first data DATA1 using the first data DATA1 and the parity received through the memory interface 127. The error correction block 124 may be included in the memory interface 127 as a constituent element.

The host interface 125 may be configured to communicate with an external host device under the control of the processor 122. The host interface 125 can receive the second command CMD2 and the second address ADDR2 from the external host device and can exchange the second data DATA2 with the external host device.

The host interface 125 may be configured to communicate using at least one of various communication methods such as a universal serial bus (USB), a serial at attachment (SATA), a serial attached SCSI (SAS), a high speed interchip (HSIC), a small computer small interface (SCSI), a Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), etc.

The buffer control circuit 126 may be configured to control the RAM 130 under the control of the processor 122. The buffer control circuit 126 can write data in the RAM 130 and read data from the RAM 130.

The memory interface 127 may be configured to communicate with the nonvolatile memory 110 included in the storage device 100 of FIG. 1 under the control of the processor 122. The memory interface 127 transmits the first command CMD1 and the first address ADDR1 to the nonvolatile memory 110 and can exchange the first data DATA1 and a control signal CTRL with the nonvolatile memory 110.

The storage device 100 of FIG. 1 may not include the RAM 130. That is, the storage device 100 may not have a memory (e.g., RAM 130) separate from the memory controller 120 and the nonvolatile memory 110. At this time, the buffer control circuit 126 may not be provided to the memory controller 120. A function of the RAM 130 may be performed by an internal RAM 123 of the memory controller 120.

The processor 122 can control the memory controller 120 using codes. The processor 122 can load codes from a nonvolatile memory (e.g., a read only memory) provided in the memory controller 120. The processor 122 can load codes received from the memory interface 127.

The bus 121 of the memory controller 120 may be divided into a control bus and a data bus. The data bus may be configured to transmit data in the memory controller 120 and the control bus may be configured to transmit control information, for example, a command and/or an address in the memory controller 120. The data bus and the control bus may be separated from each other and may not interfere with or affect each other. The data bus may be connected to the host interface 125, the buffer control circuit 126, the error correction block 124 and the memory interface 127. The control bus may be connected to the host interface 125, the processor 122, the buffer control circuit 126, the RAM 123, and the memory interface 127.

As described with reference to FIGS. 1 through 10, the error correction block 124 can perform an error correction decoding. When performing the error correction decoding, the error correction block 124 can selectively perform the first error correction of the simplified mode and/or the second error correction of the full mode. Thus, error correction speeds of the memory controller 120 and the memory controller 120 including the error correction block 124 may be improved and reliability thereof may be secured.

Figure 12:
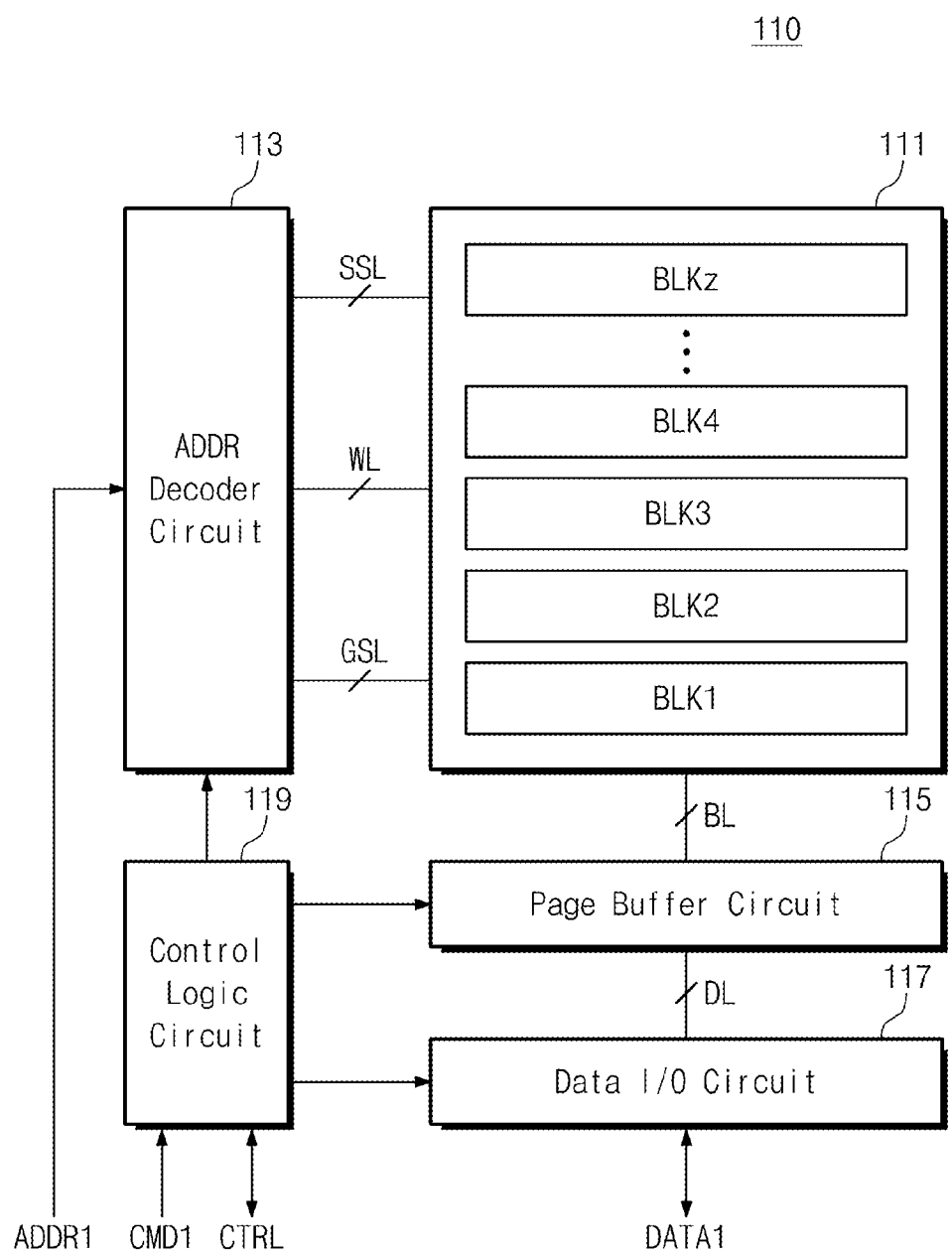
FIG. 12 is a block diagram illustrating a nonvolatile memory in accordance with an example embodiment of the inventive concepts.

FIG. 12 is a block diagram illustrating a nonvolatile memory in accordance with an example embodiment of the inventive concepts. Referring to FIGS. 1 and 12, the nonvolatile memory 110 includes a memory cell array 111, an address decoder circuit 113, a page buffer circuit 115, a data input/output circuit 117, and a control logic circuit 119.

The memory cell array 111 may include a plurality of memory blocks BLK1~BLKz. Each memory block includes a plurality of memory cells. Each memory block may be connected to the address decoder circuit 113 through at least one string select line SSL, a plurality of word lines WL and at least one ground select line GSL. The memory blocks BLK1~BLKz may be connected to a plurality of bit lines BL in common. Memory cells of the memory blocks BLK1~BLKz may have the same structure. Each of the memory blocks BLK1~BLKz may be a unit for an erase operation. Memory cells of the memory cell array 111 may be erased by a memory block unit. Memory cells included in one memory block may be erased at the same time. Each memory block may be divided into a plurality of sub blocks. Each sub block may be a unit for an erase operation.

The address decoder circuit 113 may be connected to the memory cell array 111 through the plurality of ground select lines GSL, the plurality of word lines WL and the plurality of string select lines SSL. The address decoder circuit 113 may operate according to a control of the memory control circuit 119. The address decoder circuit 113 can receive a first address ADDR1 from the memory controller 120. The address decoder circuit 113 can decode the received first address ADDR1 and can control voltages applied to the plurality of word lines WL according to the decoded address.

For example, in a program operation, the address decoder circuit 113 may apply a program voltage VGPM to a selected word line of a selected memory block indicated by the first address ADDR1 and may apply a pass voltage VPASS to unselected word lines of the selected memory block. In a read operation, the address decoder circuit 113 may apply a select read voltage VRD to the selected word line of the selected memory block indicated by the first address ADDR1 and may apply an unselect read voltage VREAD to the unselected word lines of the selected memory block. In an erase operation, the address decoder circuit 113 may apply an erase voltage (for example, a ground voltage) to word lines of the selected memory block indicated by the first address ADDR1.

The page buffer circuit 115 may be connected to the memory cell array 111 through the bit lines BL. The page buffer circuit 115 may be connected to the data input/output circuit 117 through a plurality of data lines DL. The page buffer circuit 115 operates under the control of the control logic circuit 119.

The page buffer circuit 115 can store data to be programmed in memory cells of the memory cell array 111 or data to be read from the memory cells. In a program operation, the page buffer circuit 115 can store data to be programmed in the memory cells. The page buffer circuit 115 can bias the bit lines BL on the basis of the stored data. In the program operation, the page buffer circuit 115 may function as a write driver. In a read operation, the page buffer circuit 115 can sense voltages of the bit lines BL and can store a sensing result. In the read operation, the page buffer circuit 115 can function as a sense amplifier.

The data input/output circuit 117 may be connected to the page buffer circuit 115 through the data lines DL. The data input/output circuit 117 can exchange the first data DATA1 with the memory controller 120.

The data input/output circuit 117 can temporarily store data received from the memory controller 120. The data input/output circuit 117 can transmit the stored data to the page buffer circuit 115. The data input/output circuit 117 can temporarily store data transmitted from the page buffer circuit 115. The data input/output circuit 117 can transmit the stored data to the memory controller 120. The data input/output circuit 117 can function as a buffer memory.

The control logic circuit 119 may receive the first command CMD1 and the control signal CTRL from the memory controller 120. The control logic circuit 119 can decode the received first command CMD1 and can control an overall operation of the nonvolatile memory 110 according to the decoded command.

In the read operation, the control logic circuit 119 can generate a data strobe signal from a read enable signal among the received control signal CTRL to output it. In a write operation, the control logic circuit 119 can generate a data strobe signal from a write enable signal among the received control signal CTRL to output it.

Figure 13:
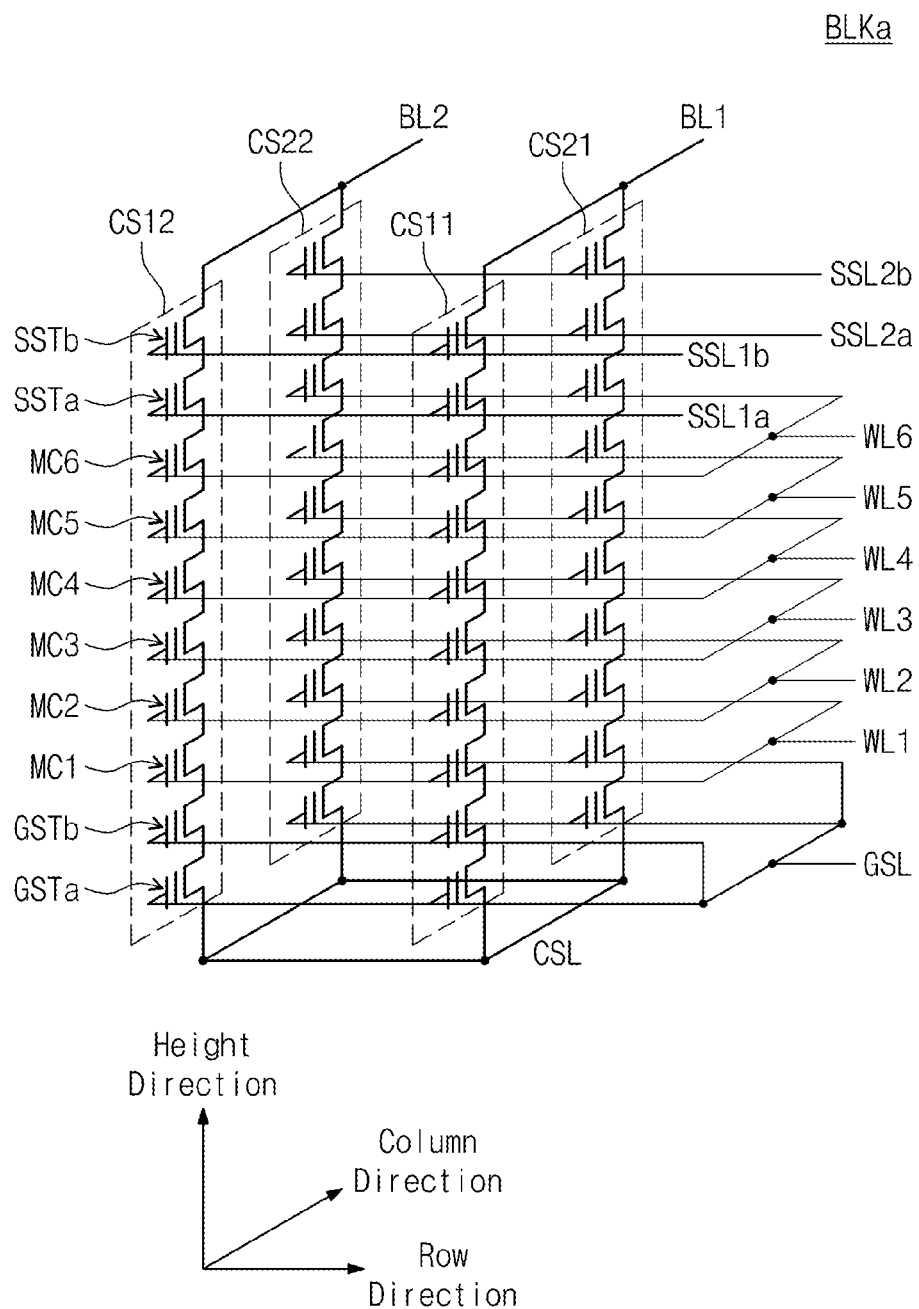
FIG. 13 is a circuit diagram illustrating a memory block in accordance with an example embodiment of the inventive concepts.

FIG. 13 is a circuit diagram illustrating a memory block BLKa in accordance with an example embodiment of the inventive concepts. Referring to FIG. 13, the memory block BLKa includes a plurality of cell strings CS11~CS21 and CS12~CS22. The cell strings CS11~CS21 and CS12~CS22 are arranged along a row direction and a column direction to form rows and columns.

For example, the cell strings CS11 and CS12 arranged along the row direction form a first row and the cell strings CS21 and CS22 arranged along the row direction form a second row. The cell strings CS11 and CS21 arranged along the column direction form a first column and the cell strings CS12 and CS22 arranged along the column direction form a second column.

Each cell string may include a plurality of cell transistors. The cell transistors include ground select transistors GSTa and GSTb, memory cells MC1~MC6 and string select transistors SSTa and SSTb. The ground select transistors GSTa and GSTb, the memory cells MC1~MC6 and the string select transistors SSTa and SSTb of each cell string may be stacked in a direction perpendicular to a plane (for example, a plane on a substrate of the memory block BLKa) on which the cell strings CS11~CS21 and CS12~CS22 are arranged along the row direction and the column direction.

The cell transistors may be charge trap transistors, threshold voltages of which vary according to a quantity of charges trapped in an insulating layer.

The lowermost ground select transistors GSTa may be connected to a common source line CSL in common.

The ground select transistors GSTa and GSTb of the cell strings CS11~CS21 and CS12~CS22 may be connected to the ground select line GSL in common.

Ground select transistors of the same height (or order) may be connected to the same ground select line and ground select transistors of different heights may be connected to the different ground select lines. For example, the ground select transistors GSTa of a first height may be connected to a first ground select line in common and the ground select transistors GSTb of a second height may be connected to a second ground select line in common.

Ground select transistors of the same row may be connected to the same ground select line and ground select transistors of different rows may be connected to different ground select lines. For example, the ground select transistors GSTa and GSTb of the cell strings CS11 and CS12 of the first row may be connected to the first ground line and the ground select transistors GSTa and GSTb of the cell strings CS21 and CS22 of the second row may be connected to the second ground line.

Memory cells located at the same height (or order) from the substrate (or the ground select transistors GST) may be connected to one word line in common and memory cells located at different heights (or orders) may be connected to different word lines respectively. For example, the memory cells MC1 may be connected to a word line WL1 in common. The memory cells MC2 may be connected to a word line WL2 in common. The memory cells MC3 may be connected to a word line WL3 in common. The memory cells MC4 may be connected to a word line WL4 in common. The memory cells MC5 may be connected to a word line WL5 in common. The memory cells MC6 may be connected to a word line WL6 in common.

In the first string select transistors SSTa of the same height of the cell strings CS11~CS21 and CS12~CS22, the first string select transistors SSTa of different rows may be connected to different string select lines SSL1a and SSL2a respectively. For example, the first string select transistors SSTa of the cell strings CS11 and CS12 may be connected to the string select line SSL1a in common. The first string select transistors SSTa of the cell strings CS21 and CS22 may be connected to the string select line SSL2a in common.

In the second string select transistors SSTb of the same height of the cell strings CS11~CS21 and CS12~CS22, the second string select transistors SSTb of different rows may be connected to different string select lines SSL1b and SSL2b respectively. For example, the second string select transistors SSTb of the cell strings CS11 and CS12 may be connected to the string select line SSL1b in common. The second string select transistors SSTb of the cell strings CS21 and CS22 may be connected to the string select line SSL2b in common.

That is, cell strings of different rows may be connected to different string select lines. String select transistors of the same height (or order) of cell strings of the same row may be connected to the same string select line. String select transistors of different heights (or orders) of cell strings of the same row may be connected to different string select lines.

String select transistors of cell strings of the same row may be connected to one string select line in common. For example, the string select transistors SSTa and SSTb of the cell strings CS11 and CS12 of the first row may be connected to one string select line in common. The string select transistors SSTa and SSTb of the cell strings CS21 and CS22 of the second row may be connected to one string select line in common.

Columns of the cell strings CS11~CS21 and CS12~CS22 may be connected to different bit lines BL1 and BL2 respectively. For example, the string select transistors SSTb of the cell strings CS11 and CS21 of the first column may be connected to the bit line BL1 in common. The string select transistors SSTb of the cell strings CS12 and CS22 of the second column may be connected to the bit line BL2 in common.

The cell strings CS11 and CS12 may form a first plane. The cell strings CS21 and CS22 may form a second plane.

In the memory block BLKa, write and read operations may be performed by a row unit. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit line BL1 and BL2. That is, the first plane is selected. When a turn-on voltage is supplied to the string select lines SSL2a and SSL2b and a turn-off voltage is supplied to the string select lines SSL1a and SSL1b, the cell strings CS21 and CS22 of the second plane are connected to the bit line BL1 and BL2. That is, the second plane is selected. In the selected plane, one row of the memory cells MC may be selected by the word lines WL1~WL6. In the selected row, a read or write operation may be performed.

In the memory block BLKa, an erase operation may be performed by a block unit or a sub block unit. When an erase operation is performed by a memory block unit, all the memory cells MC of the memory block BLKa may be erased at the same time by one erase request. When an erase operation is performed by a sub block unit, a part of the memory cells MC may be erased at the same time by one erase request and the other part of the memory cells MC may be erase-prohibited. A low voltage (for example, a ground voltage) is supplied to a word line connected to memory cells to be erased and a word line connected to erase-prohibited memory cells may be floated.

The memory block BLKa illustrated in FIG. 13 is illustrative. A technical spirit of the inventive concepts is not limited to the memory block BLKa illustrated in FIG. 13. For example, the number of rows of the cell strings may increase or decrease. As the number of rows of the cell strings changes, the number of string select lines or ground select lines being connected to rows of the cell strings and the number of cell strings connected to one bit line may also change.

The number of columns of the cell strings may increase or decrease. As the number of columns of the cell strings changes, the number of bit lines being connected to columns of the cell strings and the number of cell strings connected to one string select line may also be change.

A height of the cell strings may increase or decrease. For example, the number of ground select transistors, memory cells and string select transistors stacked on the respective cell strings may increase or decrease.

In an example embodiment of the present inventive concepts, a three dimensional (3D) memory array may be provided. The 3D memory array may be monolithically formed in one or more physical levels of arrays of memory cells having an active area, which is disposed on a silicon substrate and/or circuitry associated with the operation of those memory cells, whether such associated circuitry is above or within such substrate. The term "monolithic" means that layers of each level of the array are directly deposited on the layers of each underlying level of the array.

In an example embodiment of the present inventive concepts, the 3D memory array includes vertical NAND strings that are vertically oriented such that at least one memory cell is located over another memory cell. The at least one memory cell may comprise a charge trap layer. Each vertical NAND string may further includes at least one select transistor located over memory cells. The at least one select transistor may have the same structure as the memory cells and be formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 14:
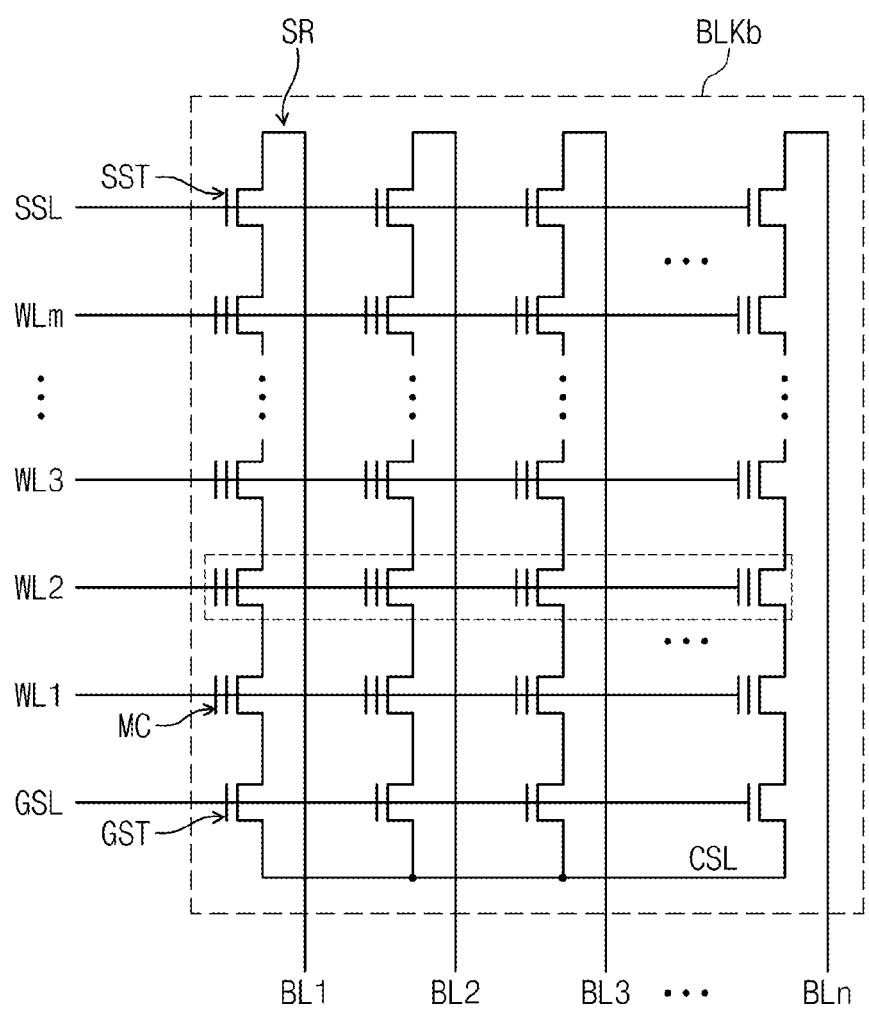
FIG. 14 is a circuit diagram illustrating a memory block in accordance with an example embodiment of the inventive concepts.

FIG. 14 is a circuit diagram illustrating a memory block BLKb in accordance with an example embodiment of the inventive concepts. Referring to FIG. 14, the memory block BLKb includes a plurality of strings SR. The strings SR may be connected to a plurality of bit lines BL1~BLn, respectively. Each string SR includes a ground select transistor GST, memory cells MC, and a string select transistor SST.

The ground select transistor GST of each string SR may be connected between the memory cells MC and a common source line CSL. The ground select transistors GST of the strings SR may be connected to the common source line CSL in common.

The string select transistor SST of each string SR may be connected between the memory cells MC and the bit line BL. The string select transistors SST of the strings SR may be connected to the bit lines BL1~BLn respectively.

In each string SR, the memory cells MC may be provided between the ground select transistor GST and the string select transistor SST. In each string SR, the memory cells MC may be serially connected to one another.

In the strings SR, memory cells MC located at the same order with respect to the common source line CSL may be connected to one word line in common. Memory cells MC of the strings SR may be connected to a plurality of word lines WL1~WLm.

In the memory block BLKb, an erase operation may be performed by a memory block unit. When an erase operation may be performed by a memory block unit, all the memory cells MC of the memory block BLKb may be erased at the same time by one erase request.

Figure 15:
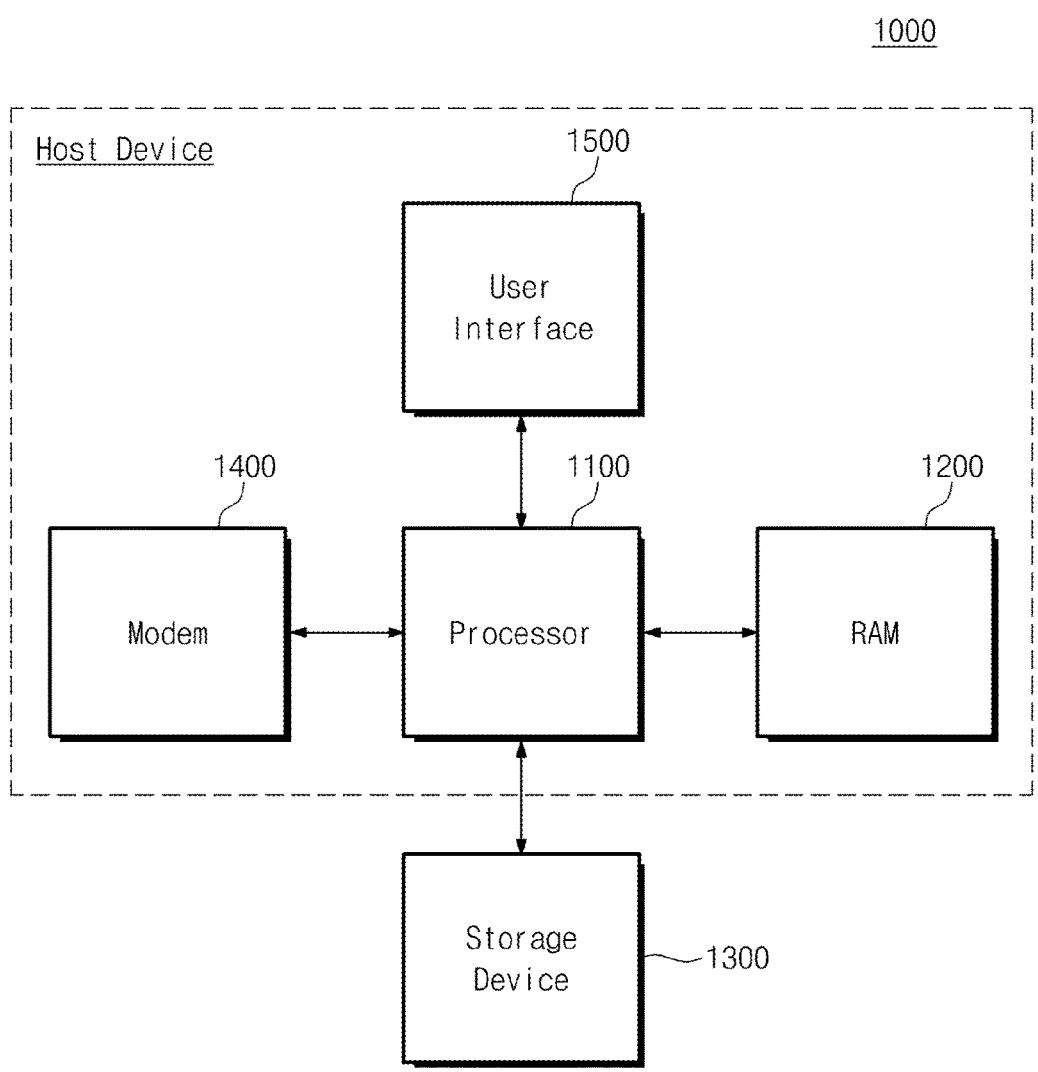
FIG. 15 is a block diagram illustrating a computing device in accordance with an example embodiment of the inventive concepts.

FIG. 15 is a block diagram illustrating a computing device 1000 in accordance with an example embodiment of the inventive concepts. Referring to FIG. 15, a computing device 1000 includes a processor 1100, a memory (e.g., RAM) 1200, a storage device 1300, a modem 1400, and a user interface 1500.

The processor 1100 can control an overall operation of the computing device 1000 and perform a logical operation. For example, the processor 1100 may be constituted by a system-on-chip. The processor 1100 may be a general-purpose processor, a special-purpose processor, or an application processor.

The RAM 1200 can communicate with the processor 1100. The RAM 1200 may be a main memory of the processor 1100 or the computing device 1000. The processor 1100 can temporarily store a code or data in the RAM 1200. The processor 1100 can execute a code and process data using the RAM 1200. The processor 1100 can execute various software programs such as an operating system and an application using the RAM 1200. The processor 1100 can control an overall operation of the computing device 1000 using the RAM 1200. The RAM 1200 may include a volatile memory such as a static RAM (SRAM), a dynamic RAM (DRAM), a synchronous DRAM (SDRAM), etc. and a nonvolatile memory such as a phase-change RAM (PRAM), a magnetic RAM (MRAM), a resistive RAM (RRAM), a ferroelectric RAM (FRAM), etc.

The storage device 1300 can communicate with the processor 1100. The storage device 1300 can store data desired to be preserved for a long period of time. That is, the processor 1100 can store the data desired to be preserved for a long period of time in the storage device 1300. The storage device 1300 can store a boot image for driving the computing device 1000. The storage device 1300 can store source codes of various softwares such as an operating system, and an application, etc. The storage device 1300 can store data processed by various software programs such as an operating system and/or an application.

The processor 1100 can drive various software programs such as an operating system and/or an application by loading source codes stored in the storage device 1300 in the RAM 1200 and executing the source codes loaded in the RAM 1200. The processor 1100 can load in the RAM 1200 data stored in the storage device 1300 and can process the data loaded in the RAM 1200. The processor 1100 can store data desired to be preserved for a long period of time among data stored in the RAM 1200.

The storage device 1300 may include a nonvolatile memory such as a flash, a PRAM (phase-change RAM), a MRAM (magnetic RAM), an RRAM (resistive RAM), a FRAM (ferroelectric RAM), etc.

The modem 1400 can perform a communication with an external device under the control of the processor 1100. For example, the modem 1400 can perform a wired or wireless communication with the external device. The modem 1400 can perform a wired or wireless communication with an external device. The modem 140 can perform a communication based on at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (RFID), or at least one of various wired communication methods such as a universal serial bus (USB), a serial at attachment (SATA), a small computer small interface (SCSI), a Firewire, a peripheral component interconnection (PCI), a PCI express (PCIe), a nonvolatile memory express (NVMe), a universal flash storage (UFS), a secure digital (SD), a SDIO, a universal asynchronous receiver transmitter (UART), a SPI (serial peripheral interface), a high speed SPI (HS-SPI), a RS232, an inter-integrated circuit (I2C), a HS-I2C, an integrated-interchip sound (I2S), a sonny/Philips digital interface (S/PDIF), a multimedia card (MMC), an embedded MMC (eMMC), etc.

The user interface 1500 can communicate with a user under the control of the processor 1100. For example, the user interface 1500 may include user input interfaces such as a keyboard, a keypad, a button, a touch panel, a touch screen, a touch pad, a touch ball, a camera, a mike, a gyroscope sensor, a vibration sensor, etc. The user interface 1500 may include user output interfaces such as a liquid crystal display (LCD), an organic light emitting diode (OLED) display, an active matrix OLED (AMOLED) display, a LED, a speaker, a motor, etc.

The storage device 1300 may include the storage device 100 in accordance with some example embodiments of the inventive concepts. The storage device 1300 may include a memory controller including an error correction decoder selectively performing a first error correction of a simplified mode and/or a second error correction of a second mode, and a nonvolatile memory. The processor 1100, the RAM 1200, the modem 1400 and the user interface 1500 can form a host device communicating with the storage device 1300.

Figure 16:
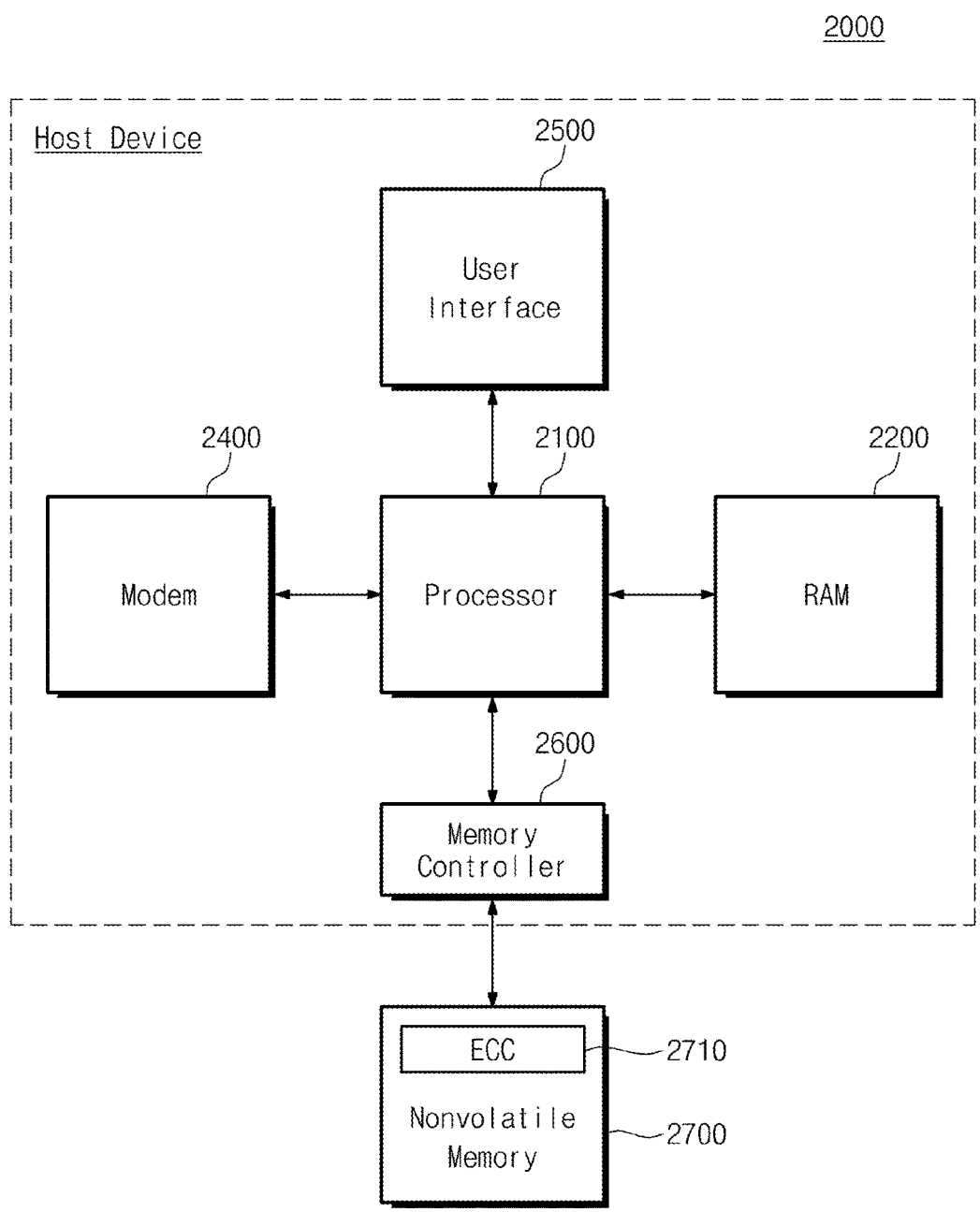
FIG. 16 is a block diagram illustrating a computing device in accordance with an example embodiment of the inventive concepts.

FIG. 16 is a block diagram illustrating a computing device 2000 in accordance with an example embodiment of the inventive concepts. Referring to FIG. 16, a computing device 2000 includes a processor 2100, a memory or RAM 2200, a modem 2400, a user interface 2500, a memory controller 2600 and a nonvolatile memory 2700.

The processor 2100, the memory 2200, the modem 2400, the user interface 2500 and the memory controller 2600 may be included in a host device accessing the nonvolatile memory 2700. The memory controller 2600 accessing the nonvolatile memory 2700 may be provided in the host device. That is, the host device can directly access the nonvolatile memory 2700. As described with reference to FIG. 1, the host device can exchange a first address ADDR1, a first command CMD1 and first data DATA1 with the nonvolatile memory 2700 through a first channel. The host device can exchange a control signal CTRL with the nonvolatile memory 2700 through a second channel.

An error correction block 2710 may be provided to the nonvolatile memory 2700. The error correction block 2710 may include at least one of the error correction decoders 200, 300 and 400 in accordance with some example embodiments of the inventive concepts. That is, the error correction block 2710 can selectively perform the first error correction of the simplified and/or the second error correction of the full mode in an error correction decoding operation.

According to some example embodiments of the inventive concepts, a simplified error correction having an improved error correction speed may be performed. If the simplified error correction fails, a full error correction having improved reliability may be performed. An error correction decoder having an improved error correction speed, improved error correction reliability and an operation method of the error correction decoder may be provided.

Although a few example embodiments of the present inventive concepts have been shown and described, it will be appreciated by those skilled in the art that changes may be made in these example embodiments without departing from the principles and spirit of the inventive concepts, the scope of which is defined in the appended claims and their equivalents.

What is claimed is:

1. An operation method of an error correction decoder correcting an error of data read from a nonvolatile memory, the operation method comprising:
   receiving data from the nonvolatile memory;
   performing an error correction with respect to the received data in a simplified mode, the simplified mode being a mode in which a portion of a process of the error correction is omitted;
   storing information about the error correction in the simplified mode in a buffer;
   performing the error correction with respect to the received data in a full mode based on the information stored in the buffer in response to the error correction failing in the simplified mode, the simplified mode being a subset of a full mode;
   terminating early the error correction by skipping at least the error correction in the full mode in response to a first condition indicating successful error correction being satisfied during performing the error correction in the simplified mode; and
   outputting results of the error correction as an error-corrected data.

2. The operation method of claim 1, wherein each of the performing an error correction in a simplified mode and the performing an error correction in a full mode includes calculating an error location polynomial, and
   wherein in the simplified mode, the calculating an error location polynomial is terminated early in response to the first condition being satisfied, and is fully performed in response to a second condition being satisfied.

3. The operation method of claim 2, wherein the calculating an error location polynomial includes performing a plurality of calculation loops, and
   the second condition includes that the error location polynomial is maintained without being renewed until a number of consecutive calculation loops reaches a threshold number.

4. The operation method of claim 3, wherein the first condition includes that the error location polynomial is calculated until a maximum loop of the plurality of calculation loops is performed.

5. The operation method of claim 2, wherein each of the performing an error correction in a simplified mode and the performing an error correction in a full mode further includes searching for errors in the received data using the error location polynomial, and
   wherein it is determined that an error correction fails in response to an highest order of the error location polynomial not coinciding with a number of errors searched.

6. The operation method of claim 1, wherein, it is determined that the received data has errors beyond a correction range in response to a failure of the error correction in the full mode.

7. The operation method of claim 1, wherein the performing an error correction in a simplified mode comprises:
   calculating syndromes based on the received data;
   calculating a first error location polynomial using the calculated syndromes;
   performing a chien search using the first error location polynomial; and
   correcting an error of the received data according to a result of the chien search,
   wherein the calculating a first error location polynomial comprises performing a plurality of calculation loops, and
   wherein the calculating a first error location polynomial is terminated early before completion in response to the first error location polynomial being maintained without being renewed until as the performing a plurality of calculation loops reach a threshold number of times.

8. The operation method of claim 7, wherein the calculating a first error location polynomial performs the performing a plurality of calculation loops while selecting different syndromes, and
   wherein each of the calculation loops comprises,
      calculating discrepancy based on a selected one of the syndromes and a first error location polynomial calculated in a previous one of the calculation loops; and renewing or maintaining the first error location polynomial according to whether the calculated discrepancy has a first value.

9. The operation method of claim 7, wherein the performing the error correction in a full mode comprises:
calculating syndromes based on the received data;
calculating a second error location polynomial using the calculated syndromes;
performing a chien search using the second error location polynomial; and
correcting an error of the received data according to a result of the chien search,
wherein the calculating a second error location polynomial comprises performing a plurality of calculation loops, and
wherein the performing a plurality of calculation loops is performed with respect to each of the calculated syndromes.

10. The operation method of claim 7, wherein when the calculating a first error location polynomial is terminated, the calculated syndromes are stored in a buffer.

11. The operation method of claim 10, wherein the performing the error correction in a full mode comprises:
reading the syndromes from the buffer;
calculating a second error location polynomial using the read syndromes;
performing a chien search using the second error location polynomial; and
correcting an error of the received data according to a result of the chien search,
wherein the calculating the second error location polynomial comprises performing a plurality of calculation loops, and
wherein the performing a plurality of calculation loops is performed with respect to each of the calculated syndromes.

12. The operation method of claim 7, further comprising:
storing in the buffer at least one of the syndromes that is not used in the performing a plurality of calculation loops and the first error location polynomial in response to the calculating a first error location polynomial being terminated.

13. The an operation method of claim 12, wherein the performing the error correction in the full mode comprises:
reading the at least one of the syndromes that is not used and the first error location polynomial from the buffer;
calculating a second error location polynomial using the at least one of the syndromes unused and the first error location polynomial;
performing a chien search using the second error location polynomial; and
correcting an error of the received data according to a result of the chien search,
wherein the calculating the second error location polynomial comprises performing a plurality of calculation loops, and
wherein the performing a plurality of calculation loops are terminated after performing the plurality of calculation loops with respect to each of the at least one of the syndromes that is not used.

14. An error correction decoder configured to correct an error of data read from a nonvolatile memory comprising:
a syndrome calculation unit configured to receive data and calculate syndromes based on the received data;
a key equation solving unit configured to receive the syndromes and calculate an error location polynomial based on the received syndromes by selecting different ones of the syndromes and repeating an error location polynomial calculation loop until either one of (1) that the error location polynomial calculation loop is performed with respect to a last one of the syndromes or that a stop condition of the error location polynomial calculation loop for an early termination is satisfied in a simplified mode, and store information about the error location polynomial calculation loop, or (2) that the error location polynomial calculation loop is performed with respect to a last one of the syndromes in a full mode based on the information, the simplified mode being a mode in which a portion of a process of an error correction is omitted and being a subset of the full mode;
a chien search unit configured to receive the error location polynomial and generate error location information by performing a chien search based on the received error location polynomial;
an error correction unit configured to receive the error location information and correct an error of the received data based on the received error location information; and
a control unit configured to select one of the simplified mode and the full mode.

15. The error correction decoder of claim 14, wherein the control unit is configured to initially select the simplified mode, and select the full mode in response to the error correction unit failing to correct the error of the received data in the simplified mode.

16. An error correction method, comprising:
receiving data;
performing an error correction with respect to the received data in a simplified mode, the simplified mode being a mode in which a portion of a process of the error correction is omitted, the performing an error correction in a simplified mode including,
calculating syndromes based on the received data,
performing a calculation loop of calculating a first error location polynomial with respect to a selected one of the syndromes,
repeating the performing a calculation loop until a number of times that a selected one of the syndromes belongs to the first error location polynomial of a previous calculation loop reaches a threshold number to estimate a first error count,
performing a chien search based on the first error location polynomial to detect a second error count, and
storing information about the error correction in the simplified mode in a buffer;
performing the error correction of the received data in a full mode in response to a determination that the error correction fails in the simplified mode based on the first and second error counts, the simplified mode being a subset of the full mode; and
terminating early the error correction by skipping at least the error correction in the full mode based on the information stored in the buffer in response to a condition indicating successful error correction being satisfied during performing the error correction in the simplified mode.

17. The error correction method of claim 16, wherein the performing an error correction in a full mode includes,
calculating syndromes based on the received data,
performing a calculation loop, the calculation loop including, calculating a second error location polynomial with respect to a selected one of the syndromes, calculating a discrepancy based on the selected one of the syndromes and the second error location polynomial of a previous calculation loop, and renewing the second error location polynomial when the discrepancy has a value other than zero, and repeating the performing a calculation loop with respect to respective ones of the syndromes.

18. The error correction method of claim 17, further comprising:

storing the syndromes calculated in the error correction in the simplified mode, wherein the calculating a second error location polynomial calculates the second error location polynomial with respect to each of the stored syndromes by performing the calculation loop included in the performing an error correction in a full mode.

19. The error correction method of claim 17, further comprising:

storing the first error location polynomial and at least one of the syndromes that is not used during the performing an error correction in a simplified mode, wherein the calculating a second error location polynomial calculates the second error location polynomial of the error correction in the full mode using the first error location polynomial and at least one of the syndromes unused during the performing an error correction in a simplified mode.

* * * * *